United States Patent
Lee et al.

(10) Patent No.: US 9,341,941 B2
(45) Date of Patent: May 17, 2016

(54) REFLECTIVE PHOTOMASK BLANK, REFLECTIVE PHOTOMASK, AND INTEGRATED CIRCUIT DEVICE MANUFACTURED BY USING REFLECTIVE PHOTOMASK

(71) Applicant: Samsung Electronics Co., Ltd., Suwon-Si, Gyeonggi-Do (KR)

(72) Inventors: Han-Shin Lee, Hwaseong-si (KR); Jae-Hyuck Choi, Seoul (KR); Soo-Wan Koh, Suwon-si (KR); Jin-Su Kim, Hwaseong-si (KR); Hyung-Ho Ko, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 2 days.

(21) Appl. No.: 14/336,643

(22) Filed: Jul. 21, 2014

(65) Prior Publication Data

US 2015/0037544 A1  Feb. 5, 2015

(30) Foreign Application Priority Data

Aug. 1, 2013  (KR) .................. 10-2013-0091700
Oct. 11, 2013  (KR) .................. 10-2013-0121501

(51) Int. Cl.
*B32B 3/00* (2006.01)
*G03F 1/52* (2012.01)
*G03F 1/24* (2012.01)

(52) U.S. Cl.
CPC .. G03F 1/52 (2013.01); G03F 1/24 (2013.01); *Y10T 428/24802* (2015.01)

(58) Field of Classification Search
CPC ...... G03F 1/24; G03F 1/52; Y10T 428/24802
See application file for complete search history.

(56) References Cited

U.S. PATENT DOCUMENTS

| | | |
|---|---|---|
| 6,734,100 B2 | 5/2004 | Park et al. |
| 6,753,133 B2 | 6/2004 | Ono et al. |
| 6,998,200 B2 | 2/2006 | Lee |
| 6,998,202 B2 | 2/2006 | Yan |
| 2007/0076833 A1 | 4/2007 | Becker et al. |
| 2011/0217633 A1 | 9/2011 | Hosoya |
| 2012/0032200 A1 | 2/2012 | Kwon et al. |
| 2013/0260292 A1* | 10/2013 | Yamazaki ........... G03F 7/70033 430/5 |
| 2014/0186753 A1* | 7/2014 | Okamura ................. G03F 1/24 430/5 |
| 2015/0010854 A1* | 1/2015 | Seo ........................... G03F 1/48 430/5 |
| 2015/0072271 A1* | 3/2015 | Lu ......................... G03F 7/2022 430/5 |
| 2015/0140477 A1* | 5/2015 | Singh ................... G03F 7/2004 430/5 |
| 2015/0205194 A1* | 7/2015 | Lin ........................... G03F 1/48 430/5 |

FOREIGN PATENT DOCUMENTS

| | | | |
|---|---|---|---|
| JP | 2009210802 A | 9/2009 |
| JP | 2013058785 A | 3/2013 |
| JP | 2013074268 A | 4/2013 |
| KR | 20100135099 A | 12/2010 |
| KR | 20110012893 A | 2/2011 |

* cited by examiner

*Primary Examiner* — Elizabeth Mulvaney
(74) *Attorney, Agent, or Firm* — Harness, Dickey & Pierce, P.L.C.

(57) ABSTRACT

A reflective photomask blank, a reflective photomask and an integrated circuit device manufactured by using a reflective photomask, include a multi-layered reflection layer; a capping layer on the multi-layered reflection layer and including a first transition metal; a passivation film contacting at least a portion of the capping layer on a side opposite to the multi-layered reflection layer and including a second transition metal and a nitrogen (N) atom; and a light absorption pattern covering a portion of the capping layer.

19 Claims, 16 Drawing Sheets

REFLECTIVE PHOTOMASK BLANK, REFLECTIVE PHOTOMASK, AND INTEGRATED CIRCUIT DEVICE MANUFACTURED BY USING REFLECTIVE PHOTOMASK

CROSS-REFERENCE TO RELATED APPLICATION

This application claims the benefit of priority under 35 U.S.C. §119 from Korean Patent Application Nos. 10-2013-0091700 and 10-2013-0121501, filed on Aug. 1, 2013 and on Oct. 11, 2013, respectively, in the Korean Intellectual Property Office, the disclosure of each of which are incorporated herein by reference in their entirety.

BACKGROUND

1. Field

Example embodiments of the inventive concepts relate to a photomask used in fabrication of semiconductor devices, and more particularly, to a reflective photomask blank used in an extreme ultraviolet (EUV) photolithography process, a reflective photomask, and an integrated circuit (IC) device manufactured by using the reflective photomask.

2. Related Art

Recently, as design rules of semiconductor devices have been drastically shrinking, the wavelength of light used in an exposure process is also decreasing. Thus, EUV that has a short wavelength has been used in the exposure process. Recently, active research has been underway into a technology for transferring a pattern onto a wafer by using a reflective exposure system including a reflective EUV photomask.

Because the wavelength used in EUV lithography may be absorbed by most materials, unlike a light exposure process using an ArF wavelength or a KrF wavelength, an EUV photomask may not use a pellicle to protect the EUV photomask. Thus, the EUV photomask is vulnerable to contamination, and also has a high possibility of contamination by carbon (C), which is a by-product of a process due to the high energy of the EUV. Accordingly, the EUV photomask requires a periodical cleaning process. Moreover, there is a need to develop a photomask having a structure in which the photomask is not damaged even when exposed to a repeated exposure process and cleaning process and is able to maintain a desired level of reflectivity, thereby having an increased lifetime.

SUMMARY

Example embodiments relate to a photomask used in fabrication of semiconductor devices, and more particularly, to a reflective photomask blank used in an extreme ultraviolet (EUV) photolithography process, a reflective photomask, and an integrated circuit (IC) device manufactured by using the reflective photomask.

Example embodiments of the inventive concepts provide a reflective photomask blank which may provide a photomask having a structure that may increase lifetimes thereof by minimizing damage to a quality of a layer forming an extreme ultraviolet (EUV) photomask even during a repeated cleaning process.

Example embodiments of the inventive concepts provide a reflective photomask having a structure in which the photomask is not damaged even when exposed to a repeated exposure process and cleaning process and is able to maintain a desired level of reflectivity, thereby having an increased lifetime.

Example embodiments of the inventive concepts provide an integrated circuit (IC) device manufactured by using a photomask having a structure that may provide an increased lifetime thereof.

According to some example embodiments of the inventive concepts, there is provided a reflective photomask blank including a multi-layered reflection layer on a photomask substrate; a capping layer on the multi-layered reflection layer and including a first transition metal; a passivation film contacting at least a portion of the capping layer on a side opposite to the multi-layered reflection layer and including a second transition metal and a nitrogen (N) atom; and a light absorption layer on the capping layer.

The capping layer may include ruthenium (Ru).

According to example embodiments of the inventive concepts, at least a portion of the passivation film may be formed of a metal nitride including ruthenium (Ru) and the nitrogen (N) atom. According to other example embodiments, at least a portion of the passivation film may be formed of a metal oxynitride including ruthenium (Ru), oxygen (O), and the nitrogen (N) atom.

The passivation film may have a nitrogen (N) concentration distribution in which the content of nitrogen is smaller towards the capping layer from a surface of the passivation film opposite to the capping layer along a thickness direction of the passivation film.

The passivation film may be between the capping layer and the light absorption layer.

According to other example embodiments of the inventive concepts, there is provided a reflective photomask including a multi-layered reflection layer on a photomask substrate; a capping layer on the multi-layered reflection layer and including a first transition metal; a passivation film contacting at least a portion of the capping layer on a side opposite to the multi-layered reflection layer and including a second transition metal and a N atom; and a light absorption pattern covering a portion of the capping layer.

According to some example embodiments of the inventive concepts, the passivation film may include a portion between the capping layer and the light absorption pattern.

According to some example embodiments of the inventive concepts, the passivation film may include an exposed first portion and a second portion between the capping layer and the light absorption pattern, wherein the exposed first portion and the second portion may each independently contact the capping layer.

According to some example embodiments of the inventive concepts, the passivation film may include a first portion contacting the capping layer and a second portion covering the light absorption pattern, wherein the second portion may be spaced apart from the capping layer.

According to other example embodiments, the first portion and the second portion of the passivation film may each independently exposed.

According to other example embodiments, the first portion and the second portion may be formed of different elements.

According to still other example embodiments, the first portion and the second portion may be formed of the same elements.

The reflective photomask may further include a buffer pattern between the capping layer and the light absorption pattern and formed of a different element from the capping layer and the passivation film.

According to further example embodiments of the inventive concepts, there is provided an integrated circuit (IC) device manufactured by using a reflective photomask according to example embodiments of the inventive concepts.

According to still further example embodiments, there is provided a reflective photomask, including at least one reflection layer on a photomask substrate, a layer resistant to oxidation at least partially covering the at least one reflection layer, wherein the layer resistant to oxidation includes a first transition metal, and a light absorption layer on at least a portion the layer resistant to oxidation.

The reflective photomask may further include a passivation film either between the layer resistant to oxidation and the light absorption layer or over the light absorption layer. The passivation film may contact at least a portion of the layer resistant to oxidation, and the passivation film may include a second transition metal and nitrogen.

An upper surface of the passivation film may be at least partially exposed.

The first and second transition metals may be ruthenium, and a concentration of the ruthenium in the passivation film may either decrease or remain the same from the upper surface of the passivation film toward a lower surface of the passivation film.

At least one of the first transition metal and the second transition metal may be ruthenium.

According to yet further example embodiments, there is provided a method of manufacturing an integrated circuit (IC) device, including providing a wafer including at least one target layer; forming a photoresist layer over the at least one target layer using a reflection photomask; exposing the photoresist layer to extreme ultraviolet light; forming a photoresist pattern by developing the exposed photoresist layer; and processing the at least one target layer using the photoresist pattern, wherein the reflection photomask includes a multi-layered reflection layer formed on a photomask substrate, a capping layer formed on the multi-layered reflection layer and including a first transition metal, a passivation film contacting at least a portion of the capping layer on a side opposite to the multi-layered reflection layer, the passivation film including a second transition metal and a nitrogen (N) atom, and a light absorption pattern covering a portion of the capping layer.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
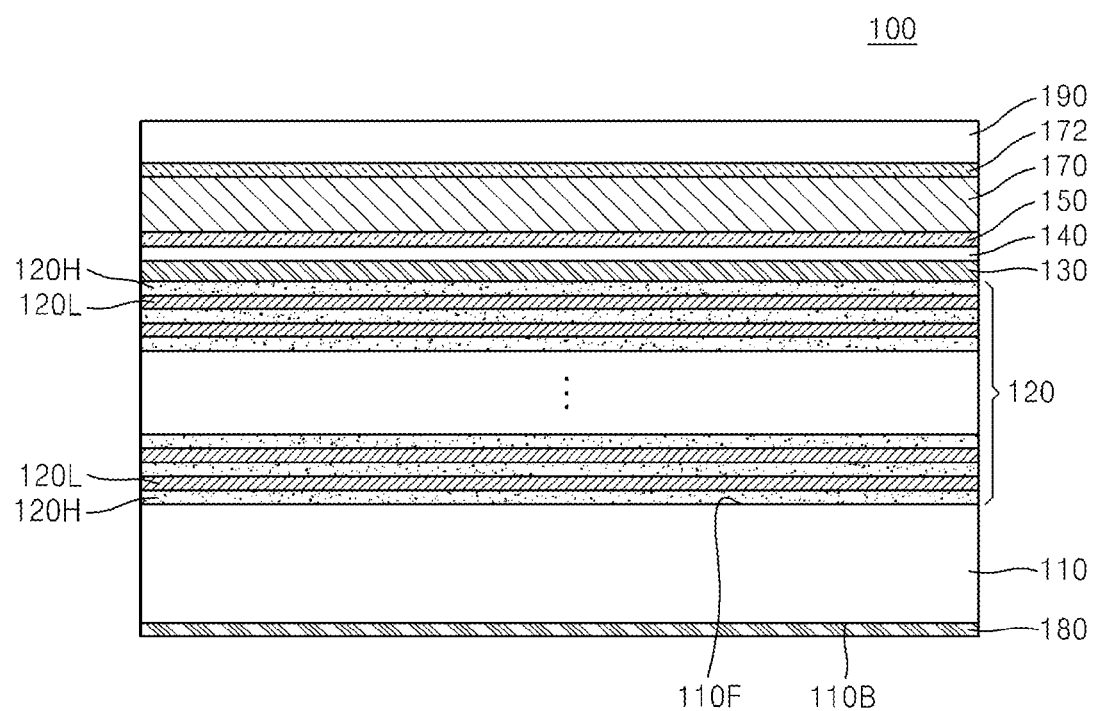
FIG. 1 is a cross-sectional view of a reflective photomask blank according to example embodiments of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Example embodiments relate to a photomask used in fabrication of semiconductor devices, and more particularly, to a reflective photomask blank used in an extreme ultraviolet (EUV) photolithography process, a reflective photomask, and a method of manufacturing an integrated circuit (IC) device by using the reflective photomask.

FIG. 1 is a cross-sectional view of a reflective photomask blank according to example embodiments of the inventive concepts.

Referring to FIG. 1, a reflective photomask blank 100 includes a multi-layered reflection layer 120 formed on a photomask substrate 110, a capping layer 130 formed on the multi-layered reflection layer 120, a passivation film 140 contacting at least a portion of the capping layer 130 on a side opposite to the multi-layered reflection layer 120, a buffer layer 150 formed on the passivation film 140, and a light absorption layer 170 formed on the buffer layer 150.

According to some example embodiments of the present inventive concepts, the capping layer 130 may include a transition metal, and the passivation film 140 may include a transition metal and a nitrogen (N) atom. According to other example embodiments, the capping layer 130 may include a transition metal, and the passivation film 140 may include a transition metal, an N atom, and an oxygen (O) atom. For example, the capping layer 130 may be formed as a metal layer formed of a single transition metal, and the passivation film 140 may be formed of a metal nitride including a nitride of the transition metal, or may be formed of a metal oxynitride in which the nitride of the transition metal is doped with an O atom.

The passivation film 140 may serve to prevent, or postpone (or reduce), oxidation of the capping layer 130 due to an external environment. According to other example embodiments, the passivation film 140 may serve to prevent, or alleviate (or reduce), the penetration of O between the multi-layered reflection layer 120 and the capping layer 130.

The photomask substrate 110 may include a dielectric material, a glass, a semiconductor, or a metal. According to some example embodiments, the photomask substrate 110 may include a material having a relatively low thermal expansion coefficient. For example, the photomask substrate 110 may include a material having a thermal expansion coefficient of about $0\pm0.05\times10^{-7}/°$ C. at 20° C. Further, the photomask substrate 110 may be composed of a flat material that is resistant to cleaning solutions. For example, the photomask substrate 110 may be composed of a synthetic quartz glass, a quartz glass, an aluminosilicate glass, a soda-lime glass, a low thermal expansion material (LTEM) such as a silicon oxide ($SiO_2$)-titanium oxide ($TiO_2$) system glass, a crystallized glass obtained by precipitating a beta-quartz solid solution, a single crystalline silicon, or a silicon carbide (SiC).

According to some example embodiments, a front side surface 110F of the photomask substrate 110 may have a flatness of about 50 nm or less, and a backside surface 110B of the photomask substrate 110 may have a flatness of about 500 nm or less. In addition, each of the front side surface 110F and the backside surface 110B of the photomask substrate 110 may have a surface roughness of about 0.15 nm or less in a root mean square (RMS) value.

The multi-layered reflection layer 120, the capping layer 130, the passivation film 140, the buffer layer 150, and the light absorption layer 170 may be sequentially formed on the front side surface 110F of the photomask substrate 110, and a low reflection layer 172 may be formed on a surface of the light absorption layer 170 that is opposite to the buffer layer 150. According to some example embodiments, a process of forming at least one of the buffer layer 150 and the low reflection layer 172 may be omitted. A backside conductive layer 180 may be formed on the backside surface 110B of the photomask substrate 110.

The multi-layered reflection layer 120 may be formed to have a multi-layered mirror structure obtained by alternately and repeatedly stacking high refraction layers 120H and low refraction layers 120L. For example, the multi-layered reflection layer 120 may be formed by alternately stacking the high refraction layers 120H and the low refraction layers 120L about twenty times to about sixty times. A topmost layer of the multi-layered reflection layer 120 may be one of the high refraction layers 120H.

According to some example embodiments, the multi-layered reflection layer 120 may be formed of a plurality of pairs of a molybdenum (Mo) layer and a silicon (Si) layer, a plurality of pairs of a molybdenum (Mo) compound layer and a silicon (Si) compound layer, a plurality of pairs of a ruthenium (Ru) layer and a Si layer, a plurality of pairs of a beryllium (Be) layer and a Mo layer, an alternately stacked lamination layer of a silicon (Si) layer and a niobium (Nb) layer, a plurality of stack structures of a Si layer, a Mo layer, and a Ru layer, a plurality of stack structures of a Si layer, a Mo layer, a Ru layer, and a Mo layer, or a plurality of stack structures of a Si layer, a Ru layer, a Mo layer, and a Ru layer.

A material and a thickness of each layer constituting the multi-layered reflection layer 120 may be appropriately selected and determined according to a wavelength of an extreme ultraviolet (EUV) ray used in an EUV lithography process and/or a desired reflectivity of the multi-layered reflection layer 120. For example, when the multi-layered reflection layer 120 is formed of a plurality of pairs of a Mo layer and a Si layer, the Mo layer corresponding to the low refraction layers 120L and the Si layer corresponding to the high refraction layers 120H may each be formed to have a thickness of about 2 nm to about 5 nm.

The multi-layered reflection layer 120 may be formed using a direct current (DC) sputtering process, a radio frequency (RF) sputtering process, or an ion beam sputtering process. For example, when the multi-layered reflection layer 120 is formed of a plurality of pairs of a Mo layer and a Si layer by using an ion beam sputtering process, the Si layer may be deposited using an argon (Ar) gas as a sputtering gas with a silicon target and the Mo layer may be deposited using an Ar gas as a sputtering gas with a Mo target. The multi-layered reflection layer 120 may be formed of about 40 to about 50 pairs of the Si layer and the Mo layer.

The capping layer 130 may protect the multi-layered reflection layer 120 such that the multi-layered reflection layer 120 is not damaged when an etching process or a defect repair process of patterning the reflective photomask blank 100 is performed to fabricate a reflective photomask. Further, the capping layer 130 may act as an oxidation resistant layer to prevent a surface of the multi-layered reflection layer 120 from being oxidized.

The capping layer 130 may include at least one transition metal selected from ruthenium (Ru), nickel (Ni), and iridium (Ir).

The capping layer 130 may be formed to have a thickness of about one nm to about 6 nm. According to some example embodiments, the capping layer 130 may be formed to have a thickness which is greater than that of the topmost layer (i.e., the high refraction layer 120H) of the multi-layered reflection layer 120. For example, the high refraction layers 120H, one of which is the topmost layer of the multi-layered reflection layer 120, may each be formed to have a thickness of about 1.5 nm to about 2.5 nm, and the capping layer 130 may be formed to have a thickness of about 3 nm to about 6 nm.

In the reflective photomask blank 100 illustrated in FIG. 1, the passivation film 140 is interposed between the capping layer 130 and the buffer layer 150. When the buffer layer 150 is omitted, the passivation film 140 may contact the capping layer 130 and the light absorption layer 170, by being disposed between the capping layer 130 and the light absorption layer 170.

The passivation film 140 may include a nitride of a transition metal that is the same type as the transition metal included in the capping layer 130, or may include an oxynitride of the transition metal.

According to some example embodiments, the capping layer 130 may be formed of a Ru layer, and at least a portion of the passivation film 140 may be formed of ruthenium nitride (RuN) including Ru and N. According to other example embodiments, the capping layer 130 may be formed of a Ru layer, and at least a portion of the passivation film 140 may be formed of ruthenium oxynitride (RuON) including Ru, O, and N.

According to some example embodiments, the passivation film 140 may be formed to have a smaller thickness than the capping layer 130. For example, the passivation film 140 may be formed to have a thickness of about 2.5 nm or less. According to some example embodiments, at least a portion of the passivation film 140 may be formed of a first atomic layer of its constituting atoms.

Figure 2A:
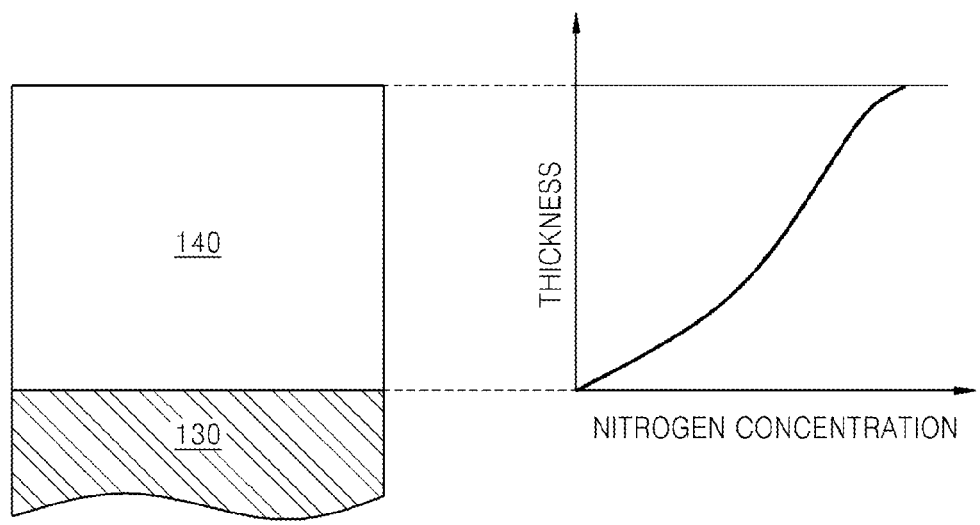
FIGS. 2A and 2B are graphs illustrating a distribution of a nitrogen (N) concentration that varies along a thickness direction of a passivation film included in a reflective photomask blank, according to example embodiments of the inventive concepts.
Figure 2B:
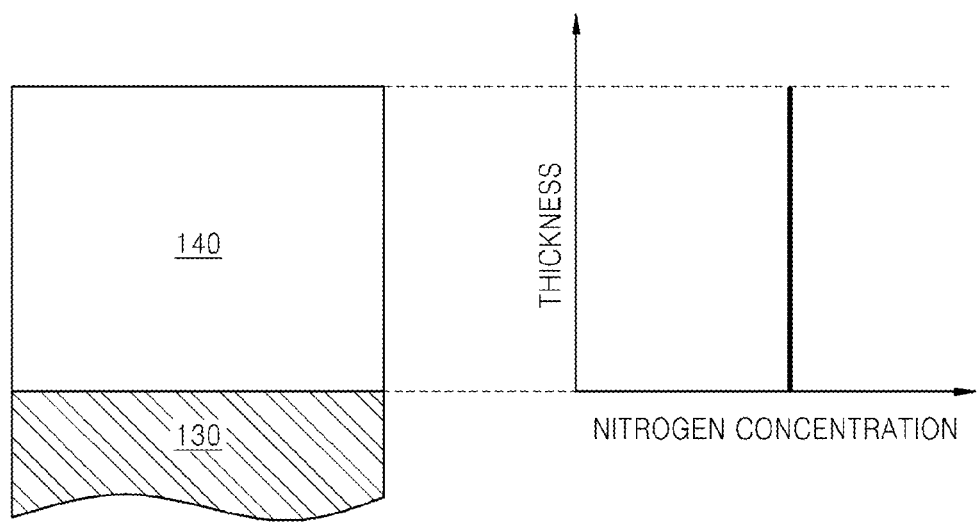

FIGS. 2A and 2B are graphs illustrating a distribution of an N concentration that varies along a thickness direction of the passivation film illustrated in FIG. 1.

To assist in understanding, FIGS. 2A and 2B illustrate a portion of the capping layer 130 along with a portion of the passivation film 140.

According to some example embodiments, as illustrated in FIG. 2A, the passivation film 140 may have a N concentration distribution in which the content of a N atom (or nitrogen) is smaller towards the capping layer 130 from a surface opposite to the capping layer 130 along a thickness direction.

According to other example embodiments, as illustrated in FIG. 2B, the passivation film 140 may have an N concentration distribution that is even throughout the whole thickness direction of the passivation film 140.

Referring again to FIG. 1, because the capping layer 130 is covered with the passivation film 140, the passivation film 140 may prevent the capping layer 130 from being damaged, or contaminated, while the reflective photomask blank 100 is formed or a portion of the reflective photomask blank 100 is etched to form a reflective photomask. Also, the passivation film 140 may prevent oxygen from being introduced into the capping layer 130, or into an interface between the capping layer 130 and the multi-layered reflection layer 120, so as to prevent forming of an undesired oxide layer. Thus, degradation of, or damage to, the multi-layered reflection layer 120 may be prevented. To this end, the endurance of the reflective photomask blank 100 may be enhanced to prevent a reflectivity of the multi-layered reflection layer 120 from being degraded even though cleaning processes, for example, accelerated cleaning processes utilizing an ultraviolet (UV) ray, are applied to the reflective photomask blank 100 or a reflective photomask obtained therefrom. This is because the capping layer 130 covering the multi-layered reflection layer 120 is protected by the passivation film 140. Thus, the lifetimes of the reflective photomask blank 100 and a reflective photomask obtained therefrom may be improved.

The buffer layer 150 may protect the capping layer 130 such that the capping layer 130 is not damaged when the light absorption layer 170 is etched using a dry etching process to form a reflective photomask. In addition, the buffer layer 150 may protect the capping layer 130 such that the multi-layered reflection layer 120 is not damaged when a repair process is performed to remove black spots (i.e., black defects), or white spots (i.e., white defects) formed in a pattern region during formation of the reflective photomask blank 100 or a reflective photomask.

The buffer layer 150 may be formed of a material having a low light absorptivity, in particular, a low EUV ray absorptivity. According to some example embodiments, the buffer layer 150 may be formed of a Ru layer, a ruthenium boride (RuB) layer, a ruthenium silicide (RuSi) layer, a Cr layer, a chrome nitride (CrN) layer, an aluminium (Al) layer, an aluminium nitride (An) layer, a tantalum (Ta) layer, a tantalum nitride (Tan) layer, a platinum (Pt.) layer, an iridium (Ire) layer, a silicon oxide ($SiO_2$) layer, a silicon nitride ($Si_3N_4$) layer, an aluminium oxide ($A_2O_3$) layer, or a combination thereof. According to some example embodiments, the buffer layer 150 may be formed of a material layer having an etch selectivity with respect to the passivation film 140 and the capping layer 130.

The buffer layer 150 may be formed using a sputtering process. For example, when the buffer layer 150 is formed of a Ru layer, the buffer layer 150 may be formed using a magnetron sputtering process that employs a ruthenium (Ru) target as a target material and an argon (Ar) gas as a sputtering gas. According to some example embodiments, the buffer layer 150 may be formed to have a thickness of about 1 nm to about 100 nm.

The light absorption layer 170 may be etched to fabricate a reflective photomask and a portion of the buffer layer 150 may be exposed after the etching of the light absorption layer 170. In the event that the buffer layer 150 is formed of a material layer having a relatively high EUV ray absorptivity, the exposed portion of the buffer layer 150 may also be etched right after the etching of the light absorption layer 170.

In FIG. 1, the passivation film 140 and the light absorption layer 170 may be separated from each other by the buffer layer 150 disposed therebetween, but example embodiments of the inventive concepts are not limited thereto. For example, the process of forming the buffer layer 150 may be omitted. In such a case, the light absorption layer 170 may be directly formed on the passivation film 140 such that the light absorption layer 170 contacts the passivation film 140.

The light absorption layer 170 may be formed of a material having a relatively high EUV ray absorptivity, that is, a relatively low EUV ray reflectivity. Further, the light absorption layer 170 may be formed of a material having an excellent chemical resistant property. According to some example embodiments, the light absorption layer 170 may be formed of a material exhibiting a maximum light reflectivity of about 5% or less with respect to a light having a wavelength of about 13.5 nm when EUV rays are irradiated onto a surface of the light absorption layer 170.

The light absorption layer 170 may be formed of a material of which a major (or majority) element is tantalum (Ta). According to some example embodiments, the light absorption layer 170 may be formed to include the major element (i.e., tantalum) and at least one element of hafnium (Hf), Si, zirconium (Zr), germanium (Ge), boron (B), N and H. For example, the light absorption layer 170 may be formed of a TaN layer, a TaHf layer, TaHfN layer, a TaBSi layer, a TaBSiN layer, a TaB layer, a TaBN layer, a TaSi layer, a TaSiN layer, a TaGe layer, a TaGeN layer, a TaZr layer, a TaZrN layer, or a combination thereof. According to some example embodiments, the light absorption layer 170 may be formed of a material having a tantalum content of at least 40 atomic %. According to some example embodiments, the light absorption layer 170 may be formed to have an oxygen content of about 25 atomic % or less in addition to a tantalum content of at least 40 atomic %.

According to some example embodiments, the light absorption layer 170 may be formed using a sputtering process, but example embodiments of the inventive concepts are not limited thereto. According to some example embodiments, the light absorption layer 170 may be formed to have a thickness of about 30 nm to about 200 nm.

The low reflection layer 172 may be formed of a material exhibiting a relatively low reflectivity in a wavelength range (e.g., a wavelength range from about 190 nm to about 260 nm) of inspection rays used in inspection of the reflective photomask blank 100 to obtain a sufficient contrast during the inspection of the reflective photomask blank 100. For example, the low reflection layer 172 may be formed of a TaBO layer, a TaBNO layer, a TaOH layer, a TaON layer or a TaONH layer. The low reflection layer 172 may be formed using a sputtering process, but example embodiments of the inventive concepts are not limited thereto.

According to some example embodiments, the low reflection layer 172 may be formed to have a thickness of about 5 nm to about 25 nm.

A mask layer 190 may be formed on a surface of the low reflection layer 172 that is opposite to the light absorption layer 170. The mask layer 190 may be formed of a hard mask layer, an electron beam resist layer, or a combination thereof. The mask layer 190 may be patterned using an electron beam lithography process and a development process to form an etch mask pattern for patterning the light absorption layer 170.

The backside conductive layer 180 formed on the backside surface 110B of the photomask substrate 110 may be advantageously utilized when the photomask substrate 110 is supported by an electrostatic chuck to prevent the photomask substrate 110 from being warped during an exposure process.

According to some example embodiments, the backside conductive layer 180 may be formed of a Cr layer or a CrN layer. The backside conductive layer 180 may be formed to have a thickness of about 20 nm to about 80 nm.

Figure 3:
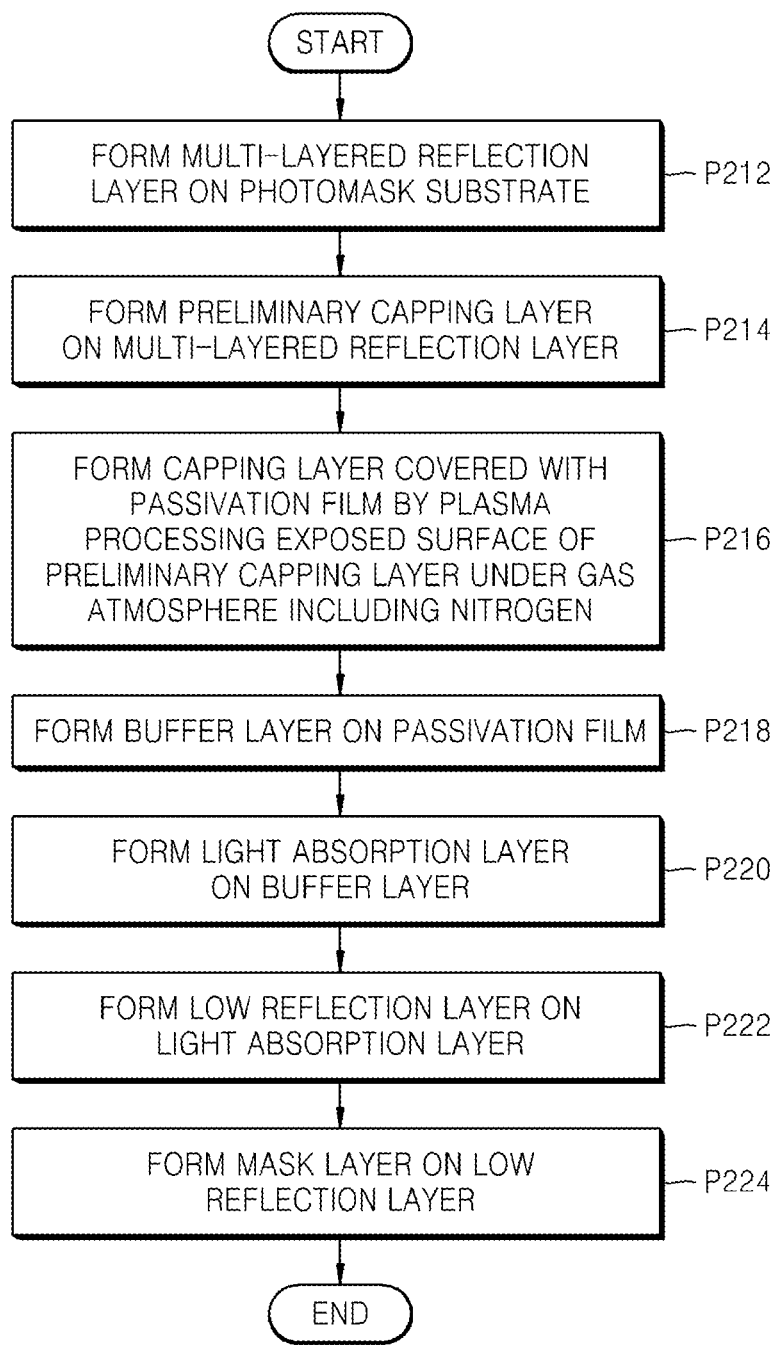
FIG. 3 is a flowchart of a manufacturing method of a reflective photomask blank, according to some example embodiments of the inventive concepts.

FIG. 3 is a flowchart of a manufacturing method of a reflective photomask blank, according to some example embodiments of the inventive concepts. The current example embodiments will be described in conjunction with the reflective photomask blank 100 illustrated in FIG. 1.

Referring to FIGS. 1 and 3, in operation P212, the multi-layered reflection layer 120 is formed on the photomask substrate 110.

The backside surface 110B of the photomask substrate 110 may be covered with the backside conductive layer 180. According to some example embodiments, a sputtering deposition apparatus may be used to form the multi-layered reflection layer 120.

In operation P214, a preliminary capping layer is formed on the multi-layered reflection layer 120. The preliminary capping layer may be formed by using the sputtering deposition apparatus that is used in operation P212 to form the multi-layered reflection layer 120. According to some example embodiments, the forming of the multi-layered reflection layer 120 and the forming of the preliminary capping layer may be performed using an in-situ process in the sputtering deposition apparatus.

According to some example embodiments, the preliminary capping layer may be formed of a thin film including at least one transition metal selected from Ru, Ni, and Ir.

The preliminary capping layer may be formed to have a greater thickness than the capping layer 130 that is described with reference to FIG. 1.

In operation P216, the capping layer 130 covered with the passivation film 140 is formed by changing a portion of the preliminary capping layer having a set (or predetermined) thickness from an exposed surface of the preliminary capping layer formed in operation P214 by plasma processing the exposed surface under a gas atmosphere including N.

According to some example embodiments, a nitration treatment may be performed on the exposed surface of the preliminary capping layer to form the passivation film 140. As a result, the portion of the preliminary capping layer having the set (or predetermined) thickness is nitration treated so that the portion of the preliminary capping layer may become the passivation film 140 formed of metal nitride and the other portion of the preliminary capping layer may remain as the capping layer 130.

For the nitration treatment, a plasma processing on the preliminary capping layer may be performed under a gas atmosphere including N. According to some example embodiments, the gas atmosphere including N may include a nitrogen ($N_2$) gas, a nitrogen monoxide (NO) gas, a dinitrogen monoxide ($N_2O$) gas, a nitrogen dioxide ($NO_2$) gas, and an ammonia ($NH_3$) gas. These gases may be used singularly or in combination.

Here, for the plasma processing, a plasma processing apparatus that may perform a plasma processing on a semiconductor wafer in a reaction chamber that may remain in a vacuum atmosphere may be used. The plasma processing apparatus is a plasma processing apparatus that is used to perform various processes, such as etching, ashing, and deposition, on a semiconductor wafer, which is an object of the process in a manufacturing process of a semiconductor device.

While a photomask substrate, on which the preliminary capping layer is formed, is loaded on a mounting table in the reaction chamber of the plasma processing apparatus and a gas including N is supplied in the reaction chamber, radio frequency power that is in range of about 100 to about 1000 W, for example, about 400 to about 600 W, may be supplied. The thickness and density of the passivation film 140 may be controlled by controlling a rate of gas flow, including N, which is supplied in the reaction chamber and by controlling a plasma processing time.

According to some example embodiments, while forming the passivation film 140, a temperature in the reaction chamber may be maintained at about 80° C. to about 120° C., for example, at about 100° C. According to some example embodiments, the plasma processing for forming the passivation film 140 may be performed for about 60 seconds to about 180 seconds. As the plasma processing time increases, the thickness and density of the passivation film 140 may increase.

According to some example embodiments, when an $N_2$ gas is used as the gas including N while forming the passivation film 140, the passivation film 140 may be formed of metal nitride including N. For example, when the preliminary capping layer is formed of Ru, the passivation film 140 may be formed of RuN.

An $N_2$ molecule readily breaks down into active nitrogen radicals when plasma is applied, and as a result, the $N_2$ molecule may be easily dissolved in a Ru layer and react with the Ru layer. Thus, a RuN thin layer that is formed toward the inside of the Ru layer from a surface of the Ru layer may be formed. The passivation film 140 formed of the RuN thin layer formed as described above may have excellent tolerance toward oxidation.

According to other example embodiments, when an $NO_2$ gas is used as the gas including N while forming the passivation film 140, the passivation film 140 may be formed of metal oxynitride including O and N.

The passivation film 140 formed in the above-described method may defer the degree of oxidation of the capping layer 130 caused by an influence of an external environment. Moreover, when exposed to an external environment, for example, to a cleaning liquid of a photomask, the passivation film 140 may prevent the degradation of a function of the photomask by preventing active oxygen radicals included in the cleaning liquid from being introduced into an underlayer of the capping layer 130, for example, into the multi-layered reflection layer 120.

Then, according to operations P218 through P224, the buffer layer 150, the light absorption layer 170, the low reflection layer 172, and the mask layer 190 are sequentially formed on the passivation film 140.

Figure 4:
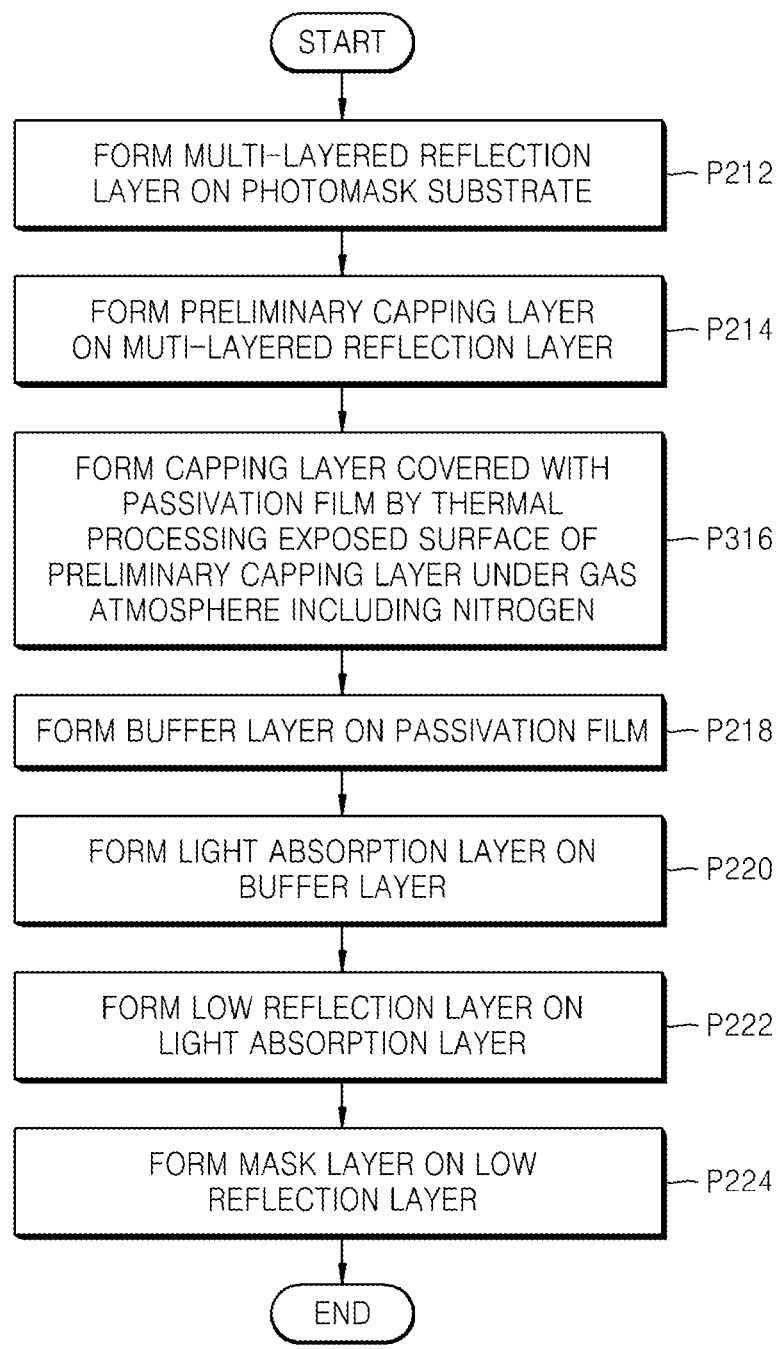
FIG. 4 is a flowchart of a manufacturing method of a reflective photomask blank, according to other example embodiments of the inventive concepts.

FIG. 4 is a flowchart of a manufacturing method of a reflective photomask blank, according to other example embodiments of the inventive concepts.

The current example embodiments will be described in conjunction with the reflective photomask blank illustrated in FIG. 1. In the flowchart of FIG. 4, operation P316 is performed instead of operation P216 of FIG. 3 to form the capping layer 130 and the passivation film 140, and other descriptions of the method are substantially the same as those of the manufacturing method described with reference to FIG. 3 and thus omitted.

Referring to FIGS. 1 and 4, in operation P316, the passivation film 140 is formed by changing a portion of the preliminary capping layer having a set (or predetermined) thickness from an exposed surface of the preliminary capping layer formed in operation P214 by thermal processing the exposed surface under a gas atmosphere including N.

According to some example embodiments, a nitration treatment may be performed on the exposed surface of the preliminary capping layer to form the passivation film 140. As a result, the portion of the preliminary capping layer having the set (or predetermined) thickness is nitration treated so that the portion of the preliminary capping layer may become the passivation film 140 formed of metal nitride and the other portion of the preliminary capping layer may remain as the capping layer 130.

For the nitration treatment, a thermal processing on the preliminary capping layer may be performed under a gas atmosphere including N. According to some example embodiments, the gas atmosphere including N may include an $N_2$ gas, an NO gas, an $N_2O$ gas, an $NO_2$ gas, and an $NH_3$ gas. These gases may be used singularly or in combination.

According to some example embodiments, for the thermal processing, electromagnetic waves may be used. The electromagnetic waves may have wavelengths of about 0.6 μm to about 1 mm. For example, the electromagnetic waves may have wavelengths of about 100 nm to about 1000 nm. The electromagnetic waves may be supplied by an infrared lamp, a solid-state laser, Ni—Cr heat rays, a ceramic heater, or a quartz heater. For example, a generator of the electromagnetic waves may include a xenon (Xe) lamp, a Xe-hydrargyrum (Hg) lamp, a ceramic heater, a quartz heater, a laser light of a diode having waves of oscillation of 808 nm, a transparent quartz infrared heater lamp, or a combination thereof.

When the heat wavelength generated from the electromagnetic waves is supplied to a gas atmosphere including N, an $N_2$ molecule in the gas atmosphere may easily break down and react with a Ru layer forming the preliminary capping layer. Thus, a RuN thin layer that is formed toward the inside of the Ru layer from a surface of the Ru layer may be formed. The passivation film 140 formed of the RuN thin layer formed as described above may have excellent tolerance toward oxidation.

The thickness and density of the passivation film 140 may be controlled by controlling a rate of gas flow including N and a thermal processing time.

According to some example embodiments, while forming the passivation film 140, a temperature in a thermal processing chamber may be maintained at about 80° C. to about 120° C., for example at about 100° C. According to some example embodiments, the thermal processing for performing the passivation film 140 may be performed for about 60 seconds to about 10 minutes. As the thermal processing time increases, the thickness and density of the passivation film 140 may increase.

Then, according to operations P218 through P224, the buffer layer 150, the light absorption layer 170, the low reflection layer 172 and the mask layer 190 are sequentially formed on the passivation film 140.

Figure 5:
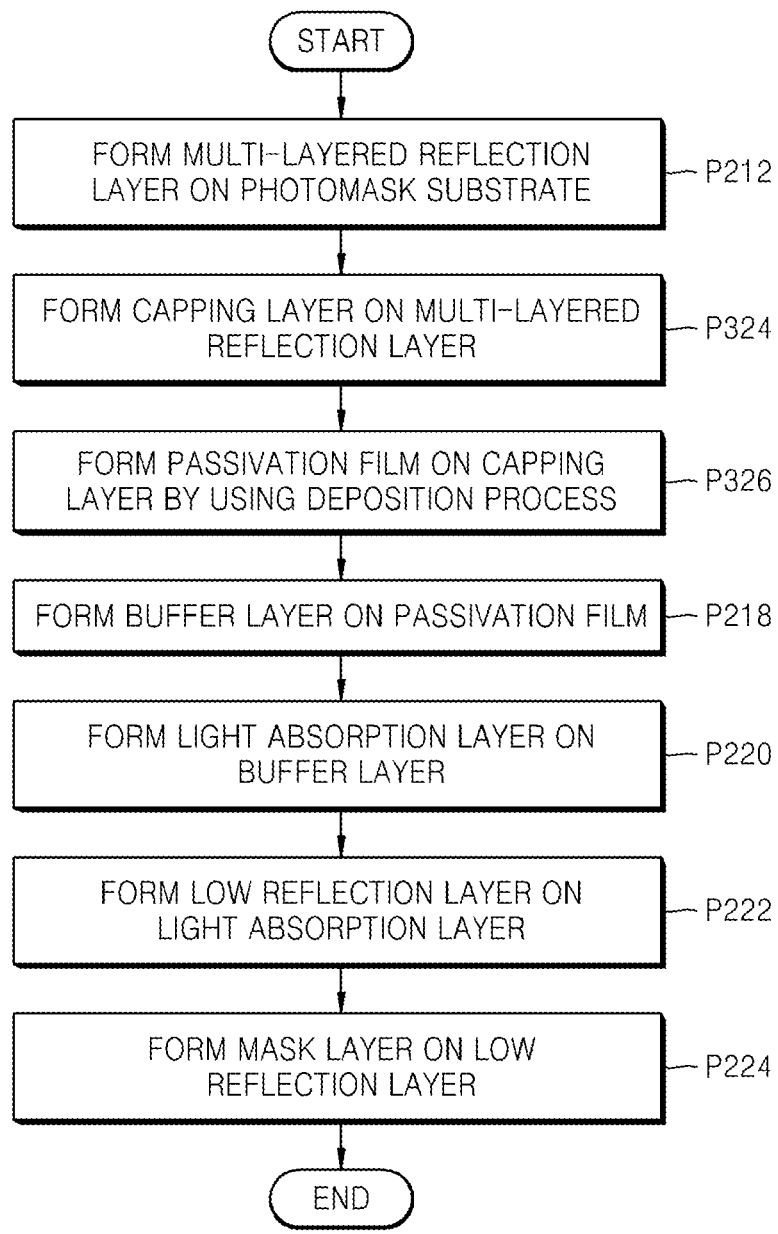
FIG. 5 is a flowchart of a manufacturing method of a reflective photomask blank, according to still other example embodiments of the inventive concepts.

FIG. 5 is a flowchart of a manufacturing method of a reflective photomask blank, according to still other example embodiments of the inventive concepts.

The current example embodiments will be described in conjunction with the reflective photomask blank illustrated in FIG. 1. In the flowchart of FIG. 5, operations P324 and P326 are performed instead of operations P 214 and P216 of FIG. 3 to form the capping layer 130 and the passivation film 140, and other descriptions of the method are substantially the same as those of the manufacturing method described with reference to FIG. 3 and thus omitted.

Referring to FIGS. 1 and 5, in operation P324, the capping layer 130 is formed on the multi-layered reflection layer 120. A more detailed description of a method of forming the capping layer 130 is similar with the method of forming the preliminary capping layer in operation P124 of FIG. 3

For a more detailed description about the capping layer 130, FIG. 1 may be referred.

In operation P326, the passivation film 140 is formed on the capping layer 130 by a deposition process.

The deposition process of forming the passivation film 140 may include chemical vapor deposition (CVD), atomic layer deposition (ALD), physical vapor deposition (PVD), plasma-enhanced CVD (PECVD), low pressure CVD (LPCVD), pulsed CVD (P-CVD), or a combination thereof.

According to some example embodiments, to form the passivation film 140 formed of a metal nitride layer including Ru and N by using the CVD or the ALD, a deposition gas may be supplied onto the photomask substrate 110 while the capping layer 130 is exposed. The deposition gas includes a Ru precursor and an N source. Along with the deposition gas, a carrier gas (for example, an inert gas), a reducing gas, or a combination thereof may be supplied.

Examples of the Ru precursor are $Ru_3(CO)_{12}$, Ru(DMPD)(EtCp)((2,4-dimethylpentadienyl)(ethylcyclopentadienyl) ruthenium), $Ru(DMPD)_2$(bis(2,4-dimethylpentadienyl ruthenium), Ru(DMPD)(MeCp)(4-dimethylpentadienyl) (methylcyclopentadienyl)ruthenium), and $Ru(EtCp)_2$(bis (ethylcyclopentadienyl)ruthenium), but it is not limited thereto.

The N source may be selected from an $N_2$ gas, an NO gas, an $N_2O$ gas, a $NO_2$ gas, an $NH_3$ gas, a N-containing radical (for example, N*, NH*, $NH_2$*), amine, and a combination thereof, but example embodiments are not limited thereto.

According to some example embodiments, when $N_2$ is used as the N source, the passivation film 140 formed of RuN may be formed. According to other example embodiments, when $NO_2$ is used as the N source, the passivation film 140 formed of RuON may be formed.

Then, according to operations P218 through P224, the buffer layer 150, the light absorption layer 170, the low reflection layer 172, and the mask layer 190 are sequentially formed on the passivation film 140.

FIGS. 6A through 6F are cross-sectional views of a manufacturing method of a reflective photomask, according to some example embodiments of the inventive concepts.

The method of manufacturing the reflective photomask 600 (refer to FIGS. 6E and 6F), described with reference to FIGS. 6A through 6F, uses the reflective photomask blank illustrated in FIG. 1. In FIGS. 6A through 6F, like reference numerals in FIG. 1 refer to like elements, and thus, detailed descriptions thereof will not be repeated here. The current example embodiments describe a case where the mask layer 190 formed on the reflective photomask blank illustrated in FIG. 1 is a hard mask layer.

Figure 6A:
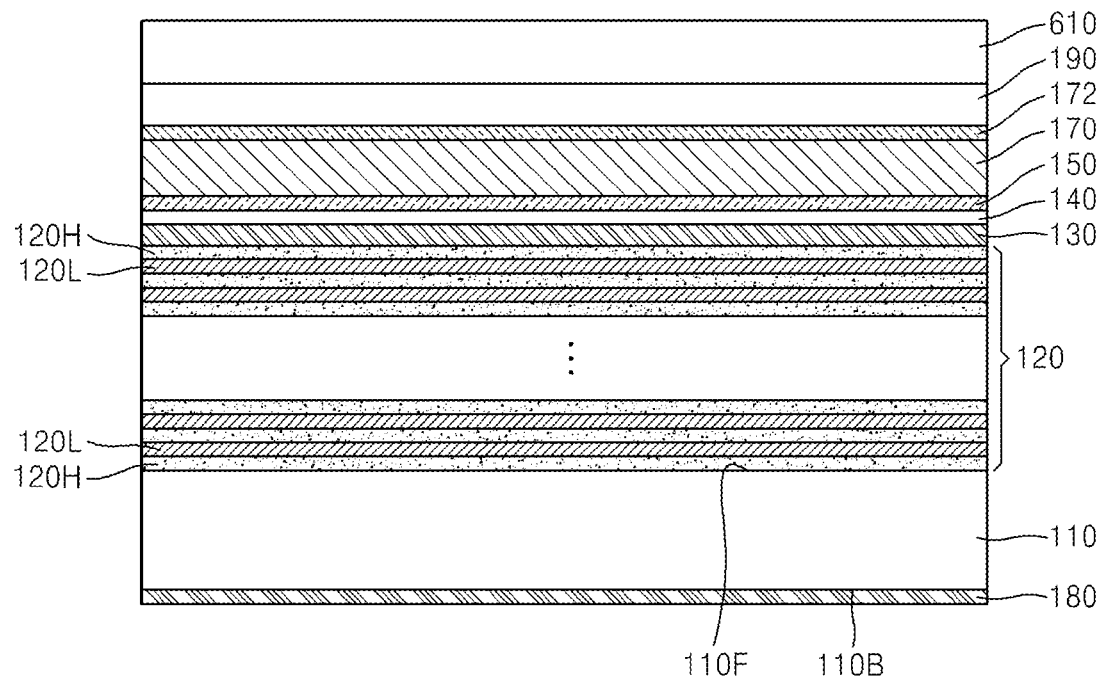
FIGS. 6A through 6F are cross-sectional views of a manufacturing method of a reflective photomask, according to some example embodiments of the inventive concepts.

Referring to FIG. 6A, a resist layer 610 for electron-beam lithography is formed on the mask layer 190 by spin coating.

According to some example embodiments, the resist layer 610 may be formed of chemically amplified resist. According to the example embodiments, the resist layer 610 may be formed to have a thickness of about 50 nm to about 100 nm.

Figure 6B:
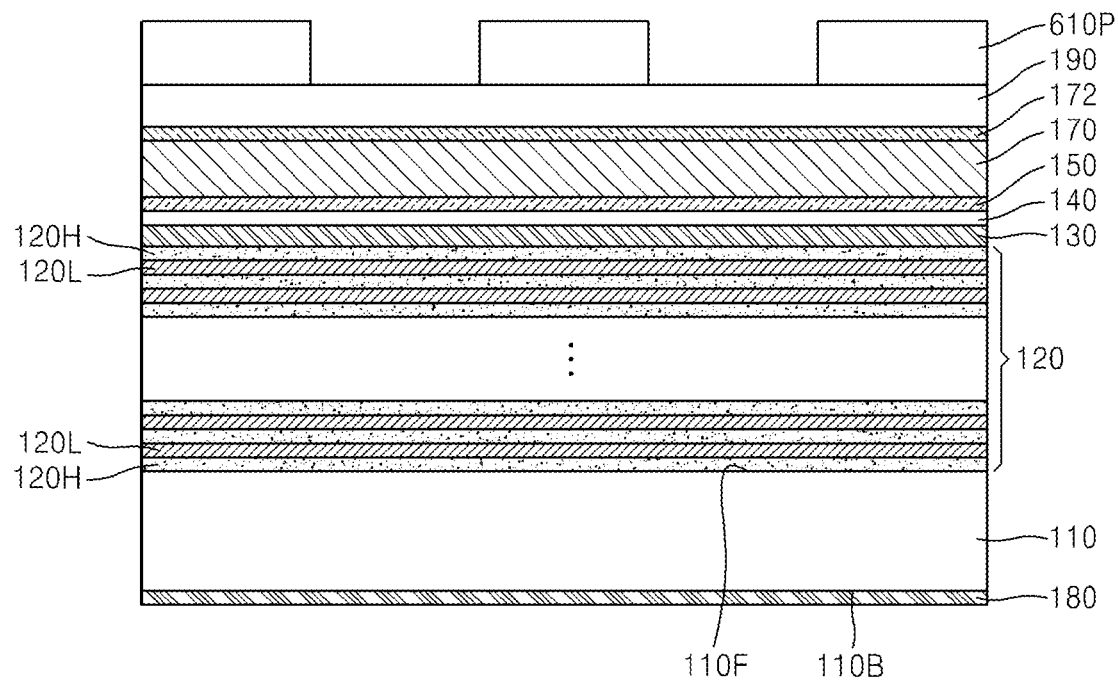

Referring to FIG. 6B, the resist layer 610 may be exposed and developed to form a resist pattern 610P defining pattern shapes which are transferred onto a wafer.

Figure 6C:
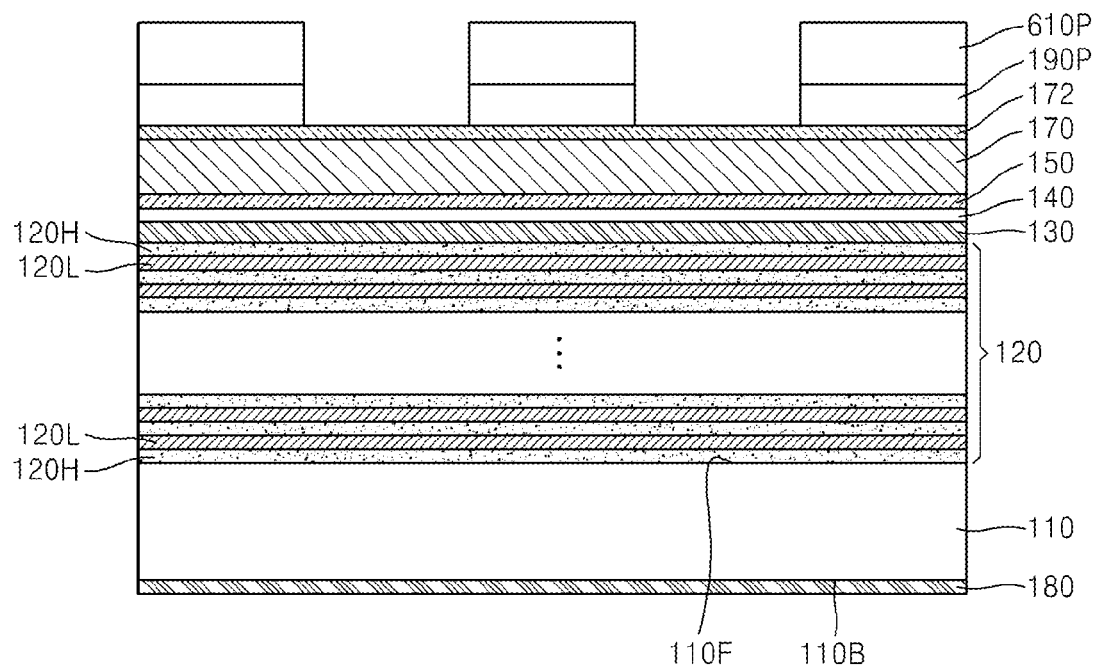

Referring to FIG. 6C, the mask layer 190 may be etched using the resist pattern 610P as an etch mask to form a mask pattern 190P.

Figure 6D:
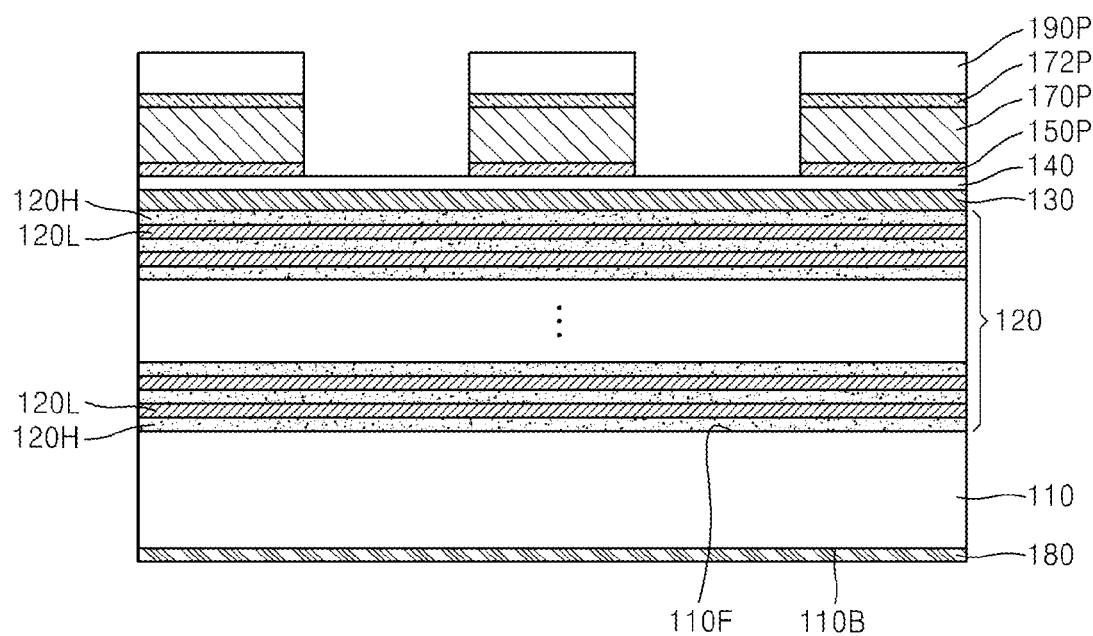

Referring to FIG. 6D, after removal of the resist pattern 610P, the low reflection layer 172, the light absorption layer 170, and the buffer layer 150 may be sequentially etched using the mask pattern 190P as an etch mask to form a low reflection pattern 172P, a light absorption pattern 170P, and a buffer pattern 150P.

A chlorine-based gas, or a mixture gas of a chlorine-based gas and an oxygen gas, may be used as an etch gas when the low reflection layer 172, the light absorption layer 170, and the buffer layer 150 are etched.

Even after the light absorption pattern 170P and the buffer pattern 150P are formed, the multi-layered reflection layer 120 may be still covered and protected by the capping layer 130. In addition, the capping layer 130 may still be covered by the passivation film 140 even after the light absorption pattern 170P and the buffer pattern 150P are formed. Thus, even though the resultant where the light absorption pattern 170P and the buffer pattern 150P are formed is exposed to an oxygen-containing atmosphere, that is, an etching process or air, the passivation film 140 may prevent oxygen atoms from being introduced into the capping layer 130 or into an interface between the multi-layered reflection layer 120 and the capping layer 130. As a result, no oxide layer may be formed between the multi-layered reflection layer 120 and the capping layer 130. Accordingly, a separation between the multi-layered reflection layer 120 and the capping layer 130, and a peeling of the capping layer 130 may be suppressed, thus improving the endurance of the reflective photomask 600 against a cleaning process.

Figure 6E:
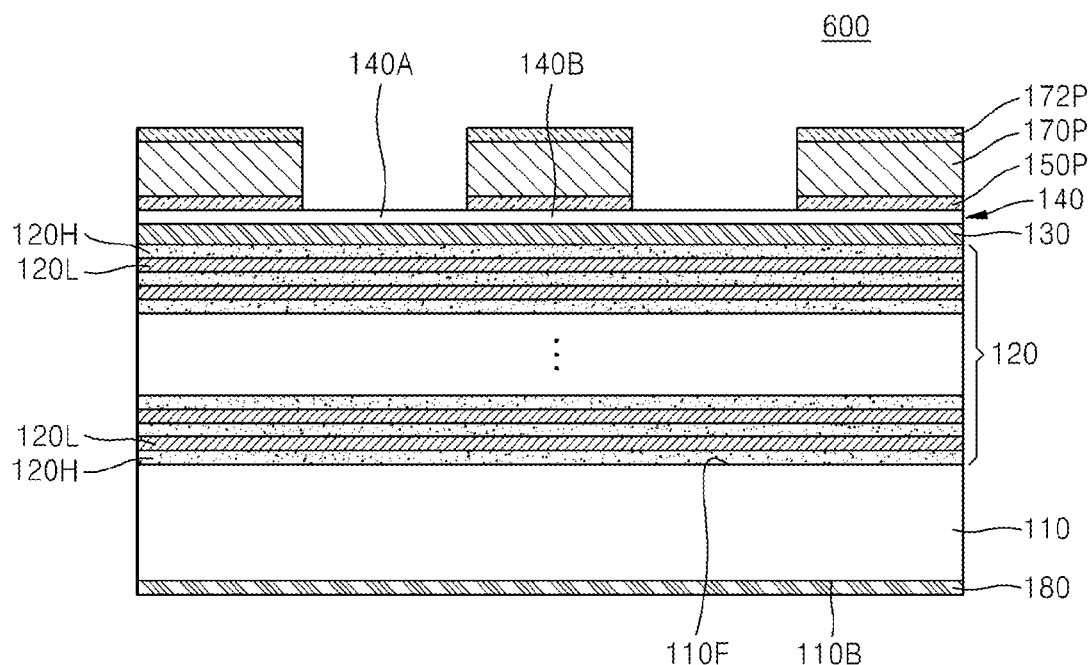

Referring to FIG. 6E, the mask pattern 190P may be removed to complete forming the reflective photomask 600.

According to some example embodiments, the mask pattern 190P may be removed using a dry etching process, but the present example embodiments of the inventive concepts are not limited thereto.

In the reflective photomask 600, the passivation film 140 includes a first portion 140A exposed to the outside and a second portion 140B interposed between the capping layer 130 and the light absorption pattern 170P. The first and second portions 140A and 140B of the passivation film 140 each independently contact the capping layer 130.

Figure 6F:
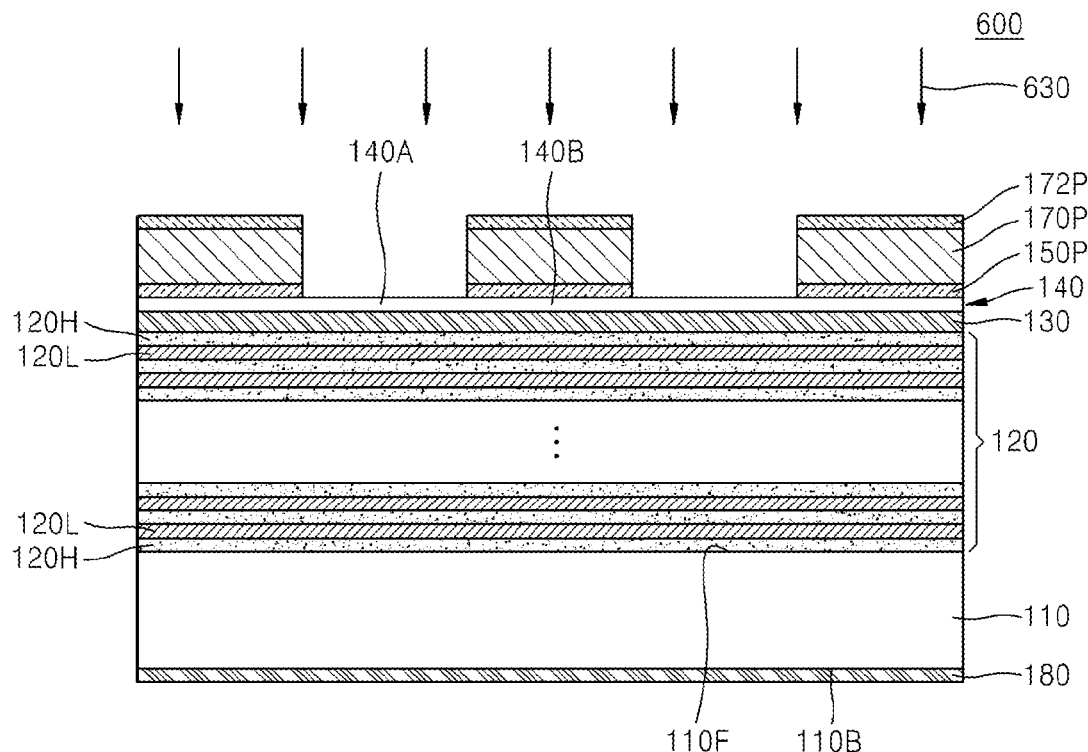

Referring to FIG. 6F, the reflective photomask 600 may be exposed to a cleaning process 630 to remove organic residues or particles remaining on the resultant where the mask pattern 190P is removed.

The cleaning process 630 may be performed using UV irradiation, a cleaning solution including de-ionized (DI) water, a sulfuric peroxide mixture (SPM), or a combination thereof, but it is not limited thereto.

According to some example embodiments, the UV irradiation may be carried out using a UV lamp. For example, the UV irradiation may be carried out by irradiating a UV ray having a wavelength of about 172 nm for about 1 minute to about 20 minutes using a UV lamp in a cleaning chamber. The organic residues and/or the particles on the reflective photomask 600 may be removed by supplying an oxygen gas and a nitrogen gas into the cleaning chamber to generate an ozone ($O_3$) gas, and by oxidizing the residues and/or the particles using hydroxyl (OH) groups generated from the ozone gas. The organic residues may be removed by oxidizing the organic residues using UV irradiation.

In the event that the reflective photomask 600 is cleaned using the cleaning solution including the DI water, the cleaning solution may be sprayed toward the reflective photomask 600 to remove particles remaining on a surface of the reflective photomask 600 with physical force. In such a case, DI water may be supplied onto the reflective photomask 600 and ultrasonic waves may be applied to the reflective photomask 600.

The reflective photomask 600 according to the present example embodiments may be formed such that the multi-layered reflection layer 120 is protected by the capping layer 130, and the capping layer 130 is covered with the passivation film 140. Thus, even though the reflective photomask 600 is exposed to the cleaning process 630 performed with UV irradiation, a cleaning solution or a combination thereof two or more times to periodically clean the reflective photomask 600, the passivation film 140 may prevent oxygen atoms from being introduced into the capping layer 130 or may prevent the capping layer 130 from being lifted. Accordingly, the passivation film 140 may prevent a reflectivity of the multi-layered reflection layer 120 from being degraded, and a lifetime of the reflective photomask 600 may be improved.

FIGS. 7A through 7E are cross-sectional views of a manufacturing method of a reflective photomask, according to other example embodiments of the inventive concepts.

FIGS. 7A through 7E show a case where a reflective photomask 700 (refer to FIG. 7E) is manufactured by using a reflective photomask blank 100A that does not include a passivation film. In FIGS. 7A through 7E, like reference numerals in FIG. 1 and FIGS. 6A through 6F refer to like elements, and thus, descriptions thereof will not be repeated here.

Figure 7A:
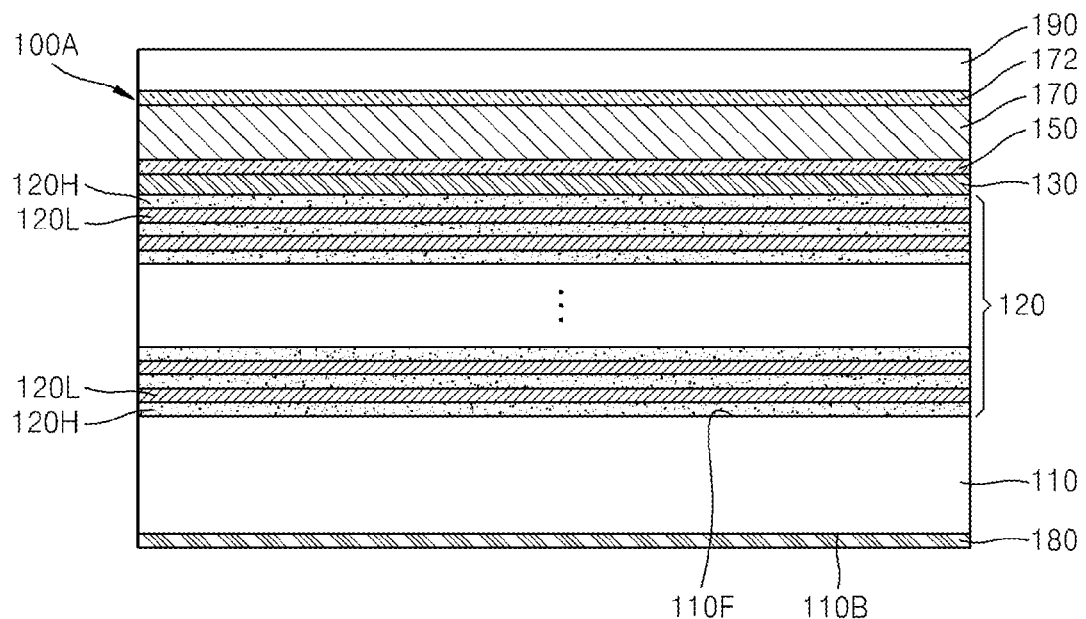
FIGS. 7A through 7E are cross-sectional views of a manufacturing method of a reflective photomask, according to other example embodiments of the inventive concepts.

Referring to FIG. 7A, the reflective photomask blank 100A substantially having the same structure as the reflective photomask blank 100 described with reference to FIG. 1 is prepared.

The reflective photomask blank 100A substantially has the same structure as the reflective photomask blank 100 illustrated in FIG. 1, except that the passivation film is omitted in the reflective photomask blank 100A.

Figure 7B:
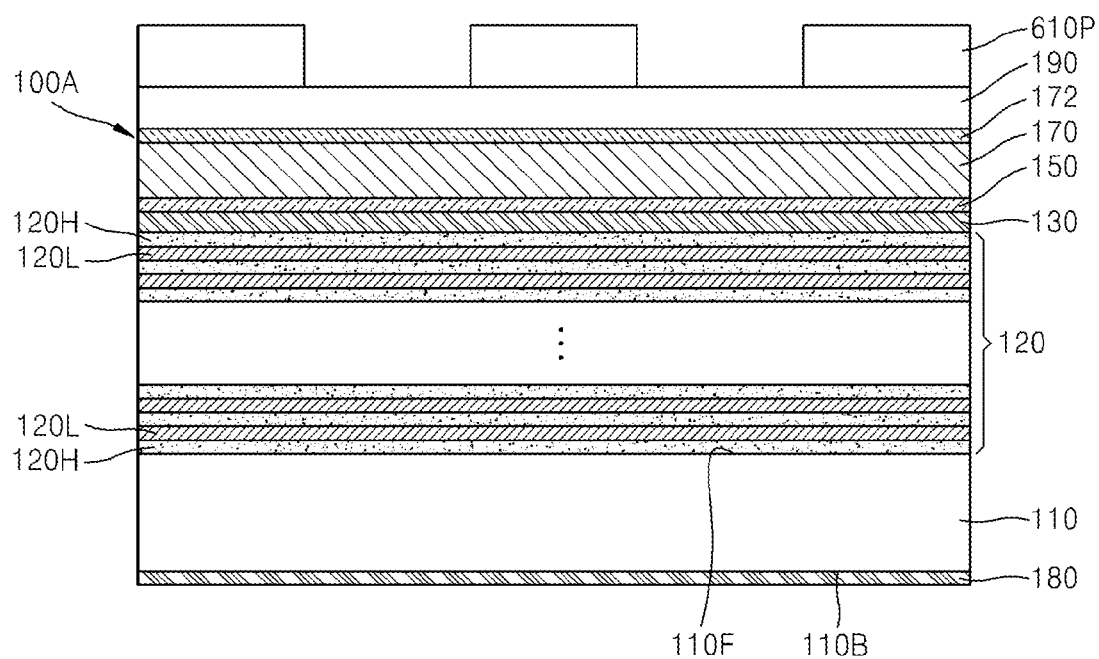

Referring to FIG. 7B, the resist layer (not shown) for electron-beam lithography is formed on the mask layer 190 in the same method as described with reference to FIGS. 6A and 6B, and then, the resist pattern 610P is formed by patterning the resist layer.

Figure 7C:
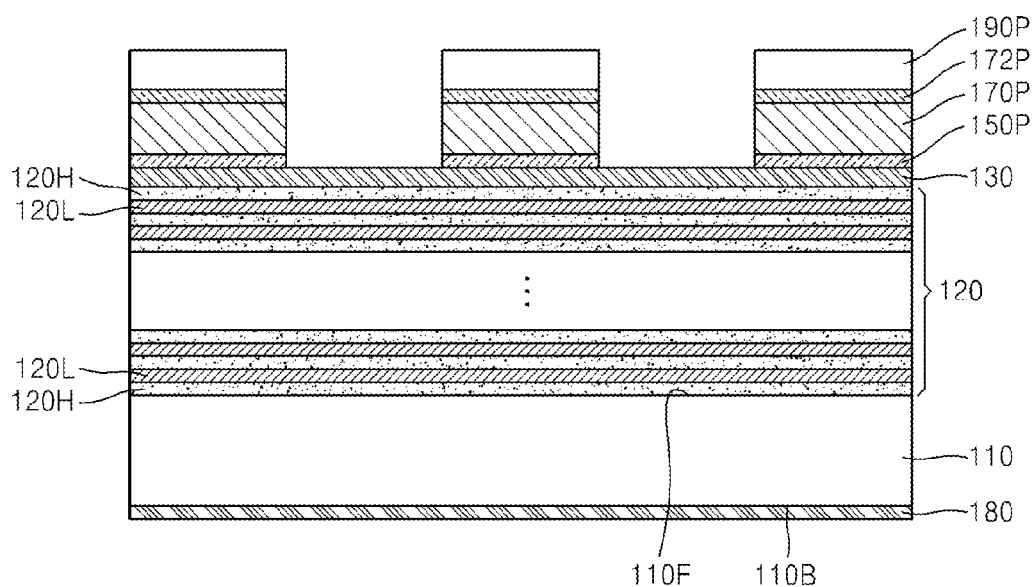

Referring to FIG. 7C, after forming the mask pattern 190P by etching the mask layer 190 by using the resist pattern 610P (refer to FIG. 7B) as an etch mask in the same method as described with reference to FIGS. 6C and 6D, the low reflection pattern 172P, the light absorption pattern 170P, and the buffer pattern 150P are formed by sequentially etching the low reflection layer 172, the light absorption layer 170, and the buffer layer 150 by using the mask pattern 190P as an etch mask.

Figure 7D:
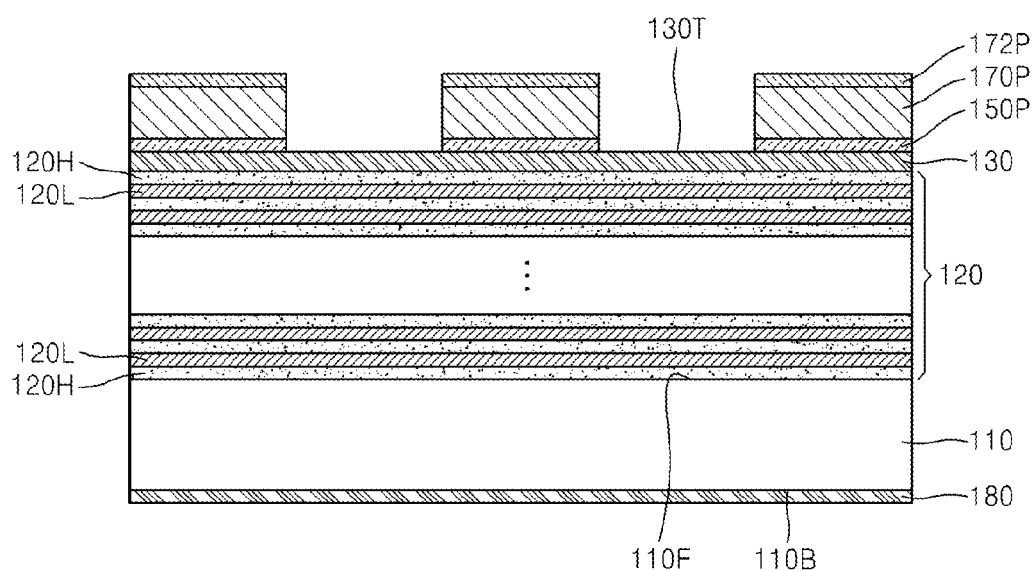

Referring to FIG. 7D, by removing the mask pattern 190P (refer to FIG. 7C), an upper surface of the low reflection pattern 172P is exposed to the outside.

When the forming of the low reflection pattern 172P is omitted, an upper surface of the light absorption pattern 170P may be exposed to the outside.

After the light absorption pattern 170P is formed, a portion of an upper surface 130T of the capping layer 130 covering the multi-layered reflection layer 120 is exposed to the outside through the light absorption pattern 170P.

Figure 7E:
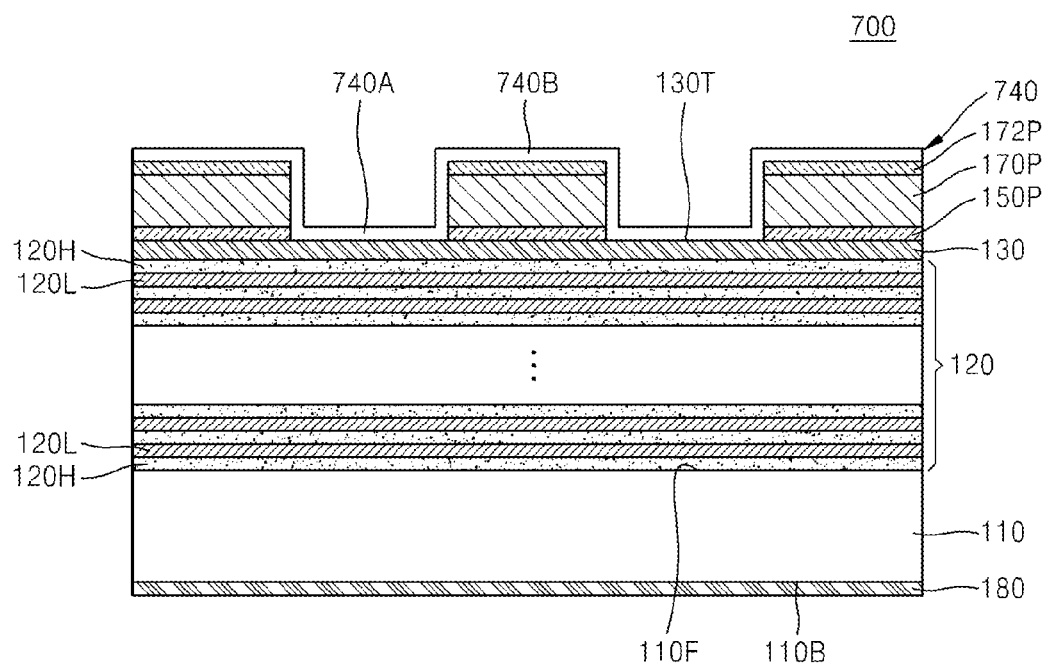

Referring to FIG. 7E, a passivation film 740 that covers at least the portion of the upper surface 130T of the capping layer 130 that is exposed to the outside, is formed.

The passivation film 740 may be formed such that the passivation film 740 may cover not only the portion of the upper surface 130T of the capping layer 130 that is exposed to the outside but also respective exposed portions of the buffer pattern 150P, the light absorption pattern 170P, and the low reflection pattern 172P.

Detailed descriptions about composition materials and a manufacturing method of the passivation film 740 are substantially the same as the descriptions of the passivation film 140 illustrated in FIG. 1.

According to some example embodiments, the passivation film 740 may be formed in a similar method as operation P216 of FIG. 3. That is, an exposed surface of the capping layer 130 may be plasma processed under a gas atmosphere including N to form the passivation film 740. As a result, an activated N radical may penetrate the capping layer 130 from an exposed surface of the capping layer 130 toward a predetermined depth of an inner portion of the capping layer 130, and thus, the passivation film 740 may be formed. The passivation film 740 may have the N concentration distribution as illustrated in FIG. 2A. For a more detailed description about the plasma processing, operation P216 of FIG. 3 may be referred to.

When the passivation film 740 is formed by a plasma processing under a gas atmosphere including N, as described in operation P216 of FIG. 3, a first portion 740A of the passivation film 740, which contacts the capping layer 130 and covers the upper surface 130T of the capping layer 130, may be formed of a metal nitride or a metal oxynitride including a metal forming the capping layer 130.

According to some example embodiments, a second portion 740B of the passivation film 740, which covers respective exposed portions of the buffer pattern 150P, the light absorption pattern 170P, and the low reflection pattern 172P in a position spaced apart from the capping layer 130, may include different elements from the first portion 740A. For example, a portion of the second portion 740B of the passivation film 740, which covers the buffer pattern 150P, may include at least some elements that form the buffer pattern 150P. A portion of the second portion 740B of the passivation film 740, which covers the light absorption pattern 170P, may include at least some elements that form the light absorption pattern 170P. A portion of the second portion 740B of the passivation film 740, which covers the low reflection pattern 172P, may include at least some elements that form the low reflection pattern 172P.

According to other example embodiments, the passivation film 740 may be formed in a similar method as operation P316 of FIG. 4. That is, the exposed surface of the capping layer 130 may be thermal processed under a gas atmosphere including N to form the passivation film 740. For a more detailed description about the thermal processing, operation P316 of FIG. 4 may be referred to.

When the passivation film 740 is formed by the thermal processing under the gas atmosphere including N as in operation P316 of FIG. 4, elements of the first and second portions 740A and 740B of the passivation film 740 may be similar with the case where the passivation film 740 is formed by the plasma processing as described in operation P216 of FIG. 3. Also, the passivation film 740 may have the same N concentration distribution as illustrated in FIG. 2A.

According to other example embodiments, the passivation film 740 may be formed in a similar method as operation P326 of FIG. 5. That is, the deposition process may be used to form the passivation film 740. For a more detailed description about the deposition process, operation P326 of FIG. 5 may be referred to.

When the passivation film 740 is formed by using the deposition process as in operation P326 of FIG. 5, the first portion 740A of the passivation film 740, which contacts the capping layer 130 and covers the upper surface 130T of the capping layer 130, and the second portion 740B of the passivation film 740, which covers the respective exposed portions of the buffer pattern 150P, the light absorption pattern 170P, and the low reflection pattern 172P in a position spaced apart from the capping layer 130, may be formed of the same elements. Also, the passivation film 740 may have the same N concentration distribution as illustrated in FIG. 2B.

In the reflective photomask 700 illustrated in FIG. 7E, the first portion 740A and the second portion 740B of the passivation film 740 are each independently exposed to the outside. The capping layer 130 is not exposed to the outside by being covered with the passivation film 740. The passivation film 740 may defer the degree of oxidation of the capping layer 130 caused by an influence of an external environment. Moreover, when exposed to an external environment, for example, to a cleaning liquid of a photomask, the passivation film 140 may prevent the degradation of a function of the photomask by preventing active oxygen radicals included in the cleaning liquid from being introduced into an underlayer of the capping layer 130, for example, into the multi-layered reflection layer 120. In particular, even though the reflective photomask 700 is exposed to the cleaning process performed with UV irradiation, a cleaning solution or a combination thereof two or more times to periodically clean the reflective photomask 700, the passivation film 740 may prevent oxygen atoms from being introduced into the capping layer 130, or may prevent the capping layer 130 from being lifted. Accordingly, the passivation film 740 may prevent a reflectivity of the multi-layered reflection layer 120 from being degraded, and a lifetime of the reflective photomask 700 may be improved.

Evaluation Example 1

Figure 8A:
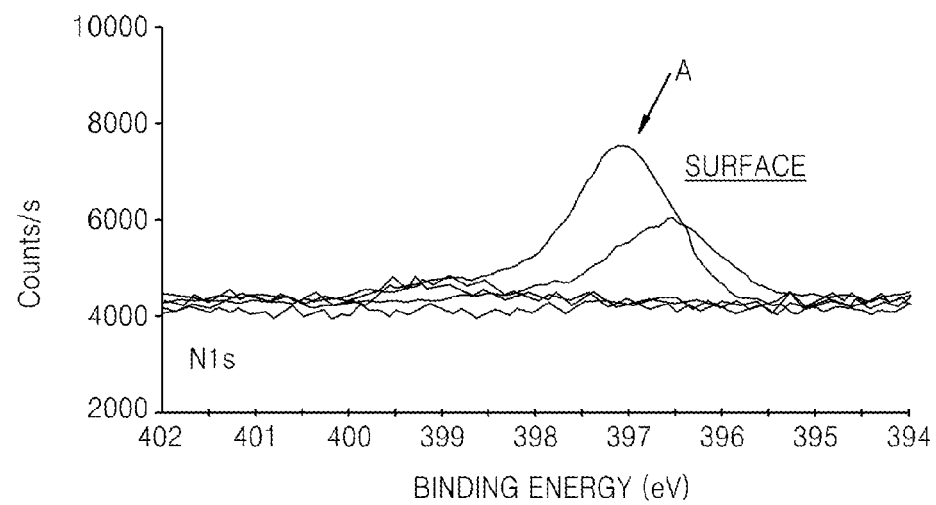
FIG. 8A is a graph illustrating a result of an x-ray photoelectron spectroscopy (XPS) analysis of a reflective photomask manufactured according to example embodiments of the inventive concepts.

FIG. 8A is a graph illustrating a result of an x-ray photoelectron spectroscopy (XPS) analysis of the reflective photomask manufactured according to the method described with reference to FIGS. 7A through 7E.

In more detail, for the evaluation of FIG. 8A, in the reflective photomask, the passivation film covering a surface of the capping layer was formed by plasma processing an exposed surface of the capping layer formed of a Ru layer under an $N_2$ atmosphere. Here, for the plasma processing of the surface of the capping layer, a plasma processing apparatus that is used to perform an ashing process on a semiconductor wafer in a common manufacturing process of a semiconductor, was used. While maintaining a temperature in a reaction chamber for the plasma processing at about 100° C., supplying the $N_2$ gas in the reaction chamber at about 350 sccm, and supplying radio frequency power of about 500 W, the exposed surface of the capping layer was plasma processed for about 120 seconds.

After repeatedly performing a cleaning process in which ozonized water and UV irradiation are combined with respect to the reflective photomask formed by the plasma processing of the exposed surface of the capping layer, an XPS analysis on a surface of the reflective photomask was performed. As a result, as shown in a portion to which arrow A of FIG. 8A points, the N element increased in a surface of the Ru layer. This shows that the passivation film formed of RuN was formed by a nitration process of the surface of the Ru layer forming the capping layer as a result of the plasma processing of the surface of the capping layer under an N atmosphere. Like this, in the photomask, a RuN layer is formed in the surface of the Ru layer, and thus, even if the photomask is exposed to an active oxygen in the cleaning process in which the ozonized water and the UV irradiation are combined, the Ru layer is protected by the RuN layer so that an oxidation of the Ru layer may be prevented.

Comparative Example 1

Figure 8B:
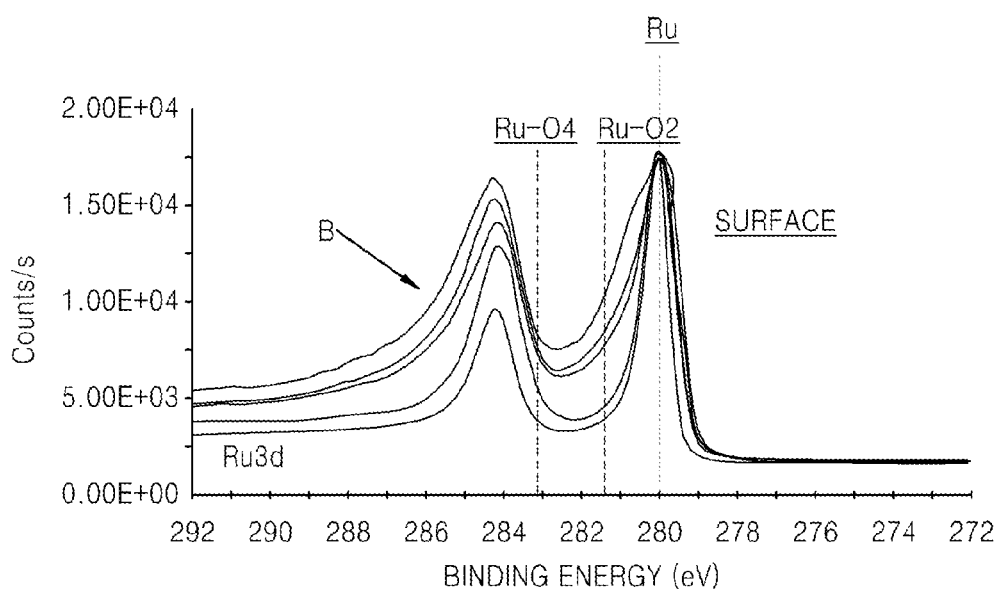
FIGS. 8B through 8D are graphs illustrating a result of an XPS analysis in a capping layer exposed to the outside, when a reflective photomask is manufactured without a process of forming a passivation film.
Figure 8C:
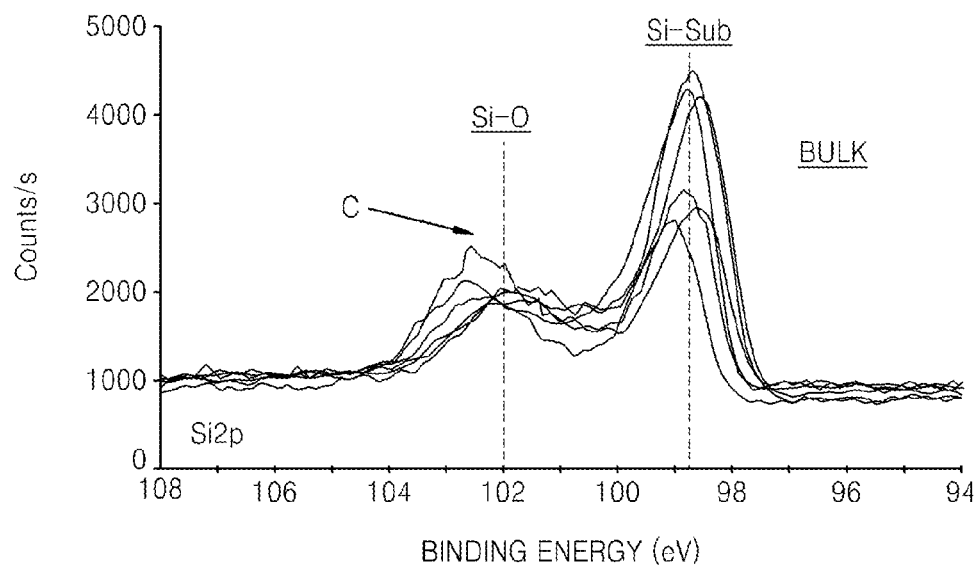
Figure 8D:
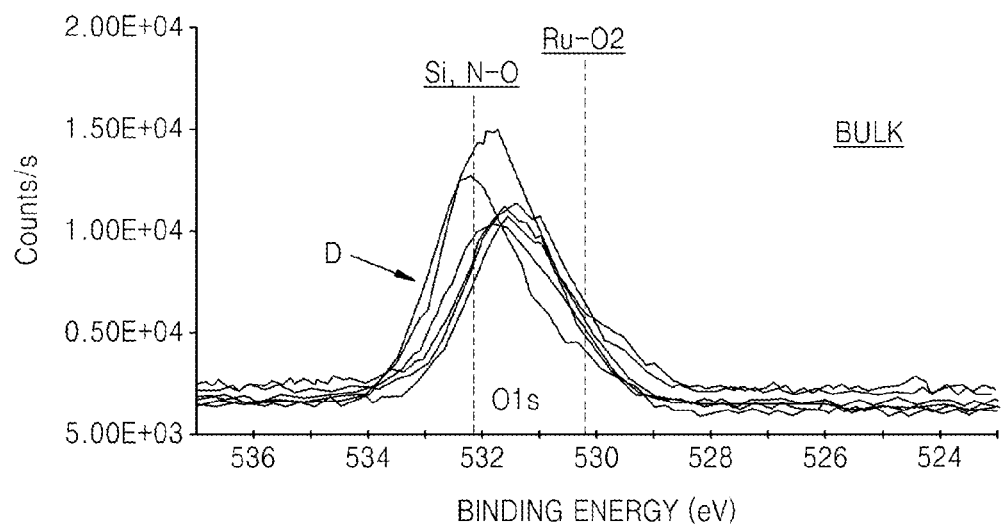

FIGS. 8B through 8D are graphs illustrating a result of an XPS analysis in the capping layer exposed to the outside, when the reflective photomask is manufactured without the forming the passivation film.

In particular, for the evaluations of FIGS. 8B through 8D, a cleaning process in which ozonized water and UV irradiation were combined was repeatedly performed with respect to the photomask in which the capping layer formed of a Ru layer was exposed to the outside, without a surface treatment by the plasma processing under a N atmosphere.

FIG. 8B is a result of an XPS analysis of a surface of the capping layer formed of a Ru layer exposed to the outside of the photomask. Also, FIGS. 8C and 8D are results of an XPS analysis of a bulk portion of the capping layer, which is exposed by etching for about 60 seconds the capping layer formed of the Ru layer exposed to the outside of the photomask from a surface of the capping layer along the thickness direction.

As shown in FIGS. 8B through 8D, as a result of repeatedly performing the cleaning process in which the ozonized water and the UV irradiation are combined, in a state where the capping layer formed of the Ru layer is exposed to the outside, without the surface treatment by the plasma processing under a N atmosphere, it was shown that a Si layer forming the multi-layered reflection layer under the Ru layer as well as the surface of the Ru layer were oxidized, as shown in portions to which arrow B of FIG. 8B, arrow C of FIG. 8C, and arrow D of FIG. 8D each independently point.

Evaluation Example 2

After repeatedly performing the cleaning process in which the ozonized water and the UV irradiation are combined, with respect to the photomask according to the example embodiment used in evaluation example 1, and to the photomask for contrast that was used in contrasting example 1, a point in which damage to the Ru layer forming the capping layer began to occur was identified.

As a result, while in the photomask according to the contrasting example, damage to the Ru layer forming the capping layer began to occur after performing the cleaning process 7 or 8 times, in the photomask according to the example embodiments, damage to the Ru layer began to occur after performing the cleaning process 25 times. Thus, it was shown that a tolerance of the photomask according to the example embodiments to the cleaning process increased.

Evaluation Example 3

Figure 9:
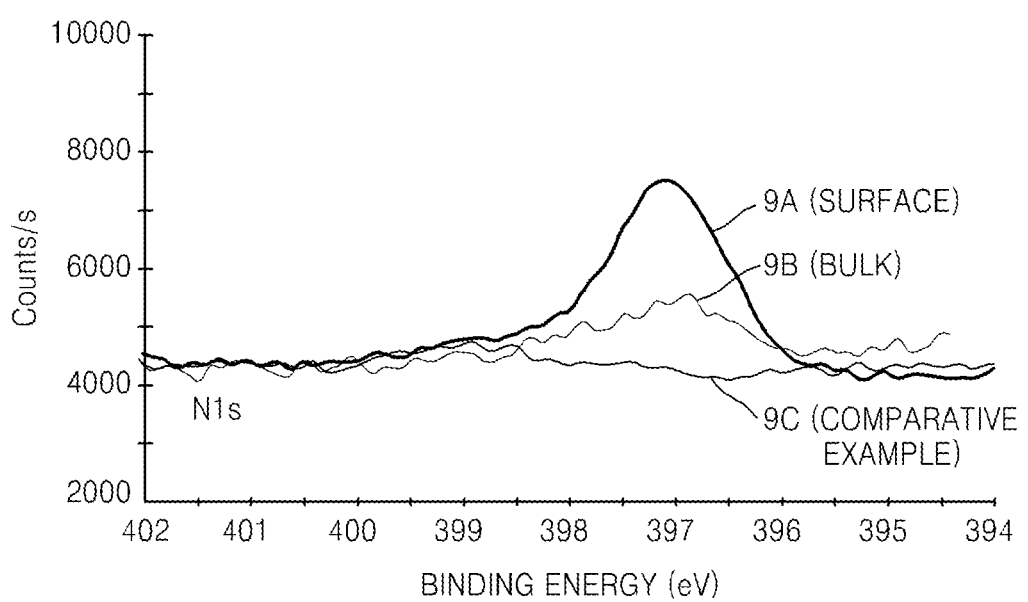
FIG. 9 is a graph illustrating an XPS analysis result in an exposed surface and a bulk portion of a passivation film, with respect to a reflective photomask manufactured according to example embodiments of the inventive concepts, in comparison with a contrasting example.

FIG. 9 is a graph illustrating XPS analyses results of an exposed surface 9A of the passivation film, and a bulk portion of the passivation film that is exposed by etching the passivation film for 2 nm from the exposed surface toward the thickness direction, with respect to the reflective photomask manufactured in the same method as described with reference to FIGS. 7A through 7E.

FIG. 9 also shows an XPS analysis result of a surface 9C of the capping layer exposed to the outside in the photomask according to the comparative example used in the evaluations of FIGS. 8B through 8D.

As shown from the result of FIG. 9, when a surface portion and a bulk portion of the passivation film were analyzed after the passivation film was formed by plasma processing the surface of the Ru layer forming the capping layer of the photomask under a N atmosphere, a N element was detected in both analyses results of the surface portion and the bulk portion. In particular, in the bulk portion, the N element was detected even in a portion that was etched for about 2 nm from the surface. This shows that the N element penetrated into the Ru layer. Thus, from the result of FIG. 9, it is understood that a passivation film formed of a RuN thin layer was formed in the surface of the capping layer formed of the Ru layer. Also, it is shown that the RuN thin layer was formed that has a N concentration profile in which as a portion of the RuN thin layer is closer to an inner portion of the RuN thin layer from a surface of the RuN thin layer along a thickness direction, the portion has a smaller N concentration.

Figure 10:
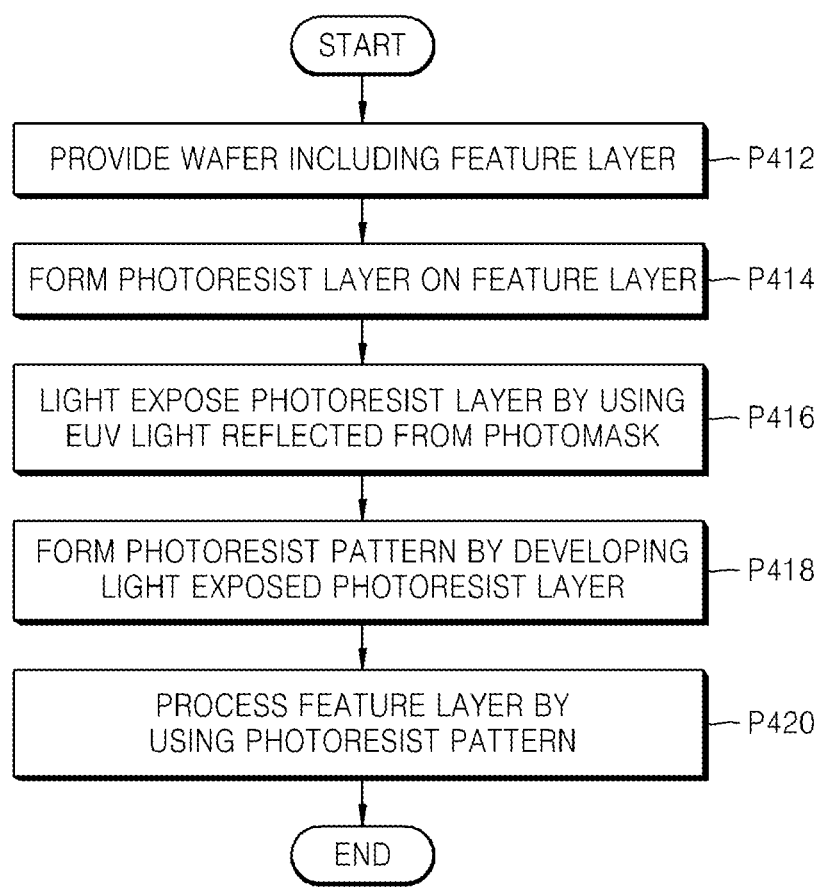
FIG. 10 is a flowchart of a manufacturing method of an integrated circuit (IC) device, according to example embodiments of the inventive concepts.

FIG. 10 is a flowchart of a manufacturing method of an integrated circuit (IC) device, according to example embodiments of the inventive concepts.

In operation P412, a wafer, including a feature layer, is provided.

According to some example embodiments, the feature layer may be a conductive layer or an insulating layer formed on the wafer. For example, the feature layer may be formed of a metal, a semiconductor, or an insulating material. According to other example embodiments, the feature layer may be a portion of the wafer.

In operation P414, a photoresist layer is formed on the feature layer. The photoresist layer may be formed of a resist material for EUV rays (13.5 nm), but the scope of the present inventive concept is not limited thereto. For example, the photoresist layer may be formed of a resist for an $F_2$ excimer laser (157 nm), a resist for an ArF excimer laser (193 nm), or a resist for a KrF excimer laser (248 nm). The photoresist layer may be formed of a positive photoresist or a negative photoresist.

According to some example embodiments, a photosensitive polymer having an acid-labile group, a potential acid, and a photoresist composition including a solvent may be spin coated on the feature layer, to form the photoresist layer formed of the positive photoresist.

According to some example embodiments, the photosensitive polymer may include a (meth)acrylate polymer. The (meth)acrylate polymer may be selected from the group of an aliphatic (meth)acrylate polymer. For example, the photosensitive polymer may be polymethylmethacrylate (PMMA), poly(t-butylmethacrylate), poly(methacrylic acid), poly(norbornylmethacrylate), a binary or ternary copolymer of repeating units of the (meth)acrylate polymer, and combinations thereof. Also, the examples of the photosensitive polymer may be substituted with various protecting groups that are acid-labile. The protecting group may be formed of a tertbutoxycarbonyl (t-BOC), tetrahydropyranyl, trimethylsilyl, phenoxyethyl, cyclohexenyl, tert-butoxycarbonylmethyl, tert-butyl, adamantly, or norbornyl group. However, example embodiments of the present inventive concepts are not limited thereto.

According to some example embodiments, latent acid may be formed of a photoacid generator (PAG), a thermoacid generator (TAG), or a combination thereof. According to some example embodiments, the PAG may be formed of a material that generates an acid when exposed to light selected from EUV light (1 to 31 nm), an $F_2$ excimer laser (157 nm), an ArF excimer laser (193 nm), and a KrF excimer laser (248 nm). The PAG may be formed of onium salt, a halogen compound, nitrobenzyl ester, alkyl sulfonate, diazonaphthoquinone derivative, iminosulfonate, disulfone, diazomethanes, sulfonyloxy ketone, etc.

In operation P416, the photoresist layer that is formed in operation P414 in the reflective light exposure system by using the photomask according to the example embodiments of the inventive concepts, is exposed to light. For example, the reflective photomask obtained from the reflective photomask blank 100 illustrated in FIG. 1 and at least one of the reflective photomasks 600 and 700 illustrated in FIGS. 6E and 7E may be used, as the photomask.

In the light exposure process, the photoresist layer may be exposed to light by using EUV light that is reflected from the multi-layered reflection layer 120 after passing through the passivation films 140 and 740 and the capping layer 130 of the reflective photomasks 600 and 700.

In operation P418, a photoresist pattern may be formed by developing the light-exposed photoresist layer.

In operation P420, the feature layer may be processed by using the photoresist pattern.

According to some example embodiments, to process the feature layer according to operation P420, a fine feature pattern may be formed by etching the feature layer by using the photoresist pattern as an etch mask.

According to other example embodiments, to process the feature layer according to operation P420, an ion impurity may be implanted into the feature layer by using the photoresist pattern as an ion implantation mask.

According to still other example embodiments, to process the feature layer according to operation P420, an extra process film may be formed on the feature layer exposed through the photoresist pattern formed in operation P418. The process film may be formed of a conductive layer, an insulating layer, a semiconductor layer, or a combination thereof.

Figure 11:
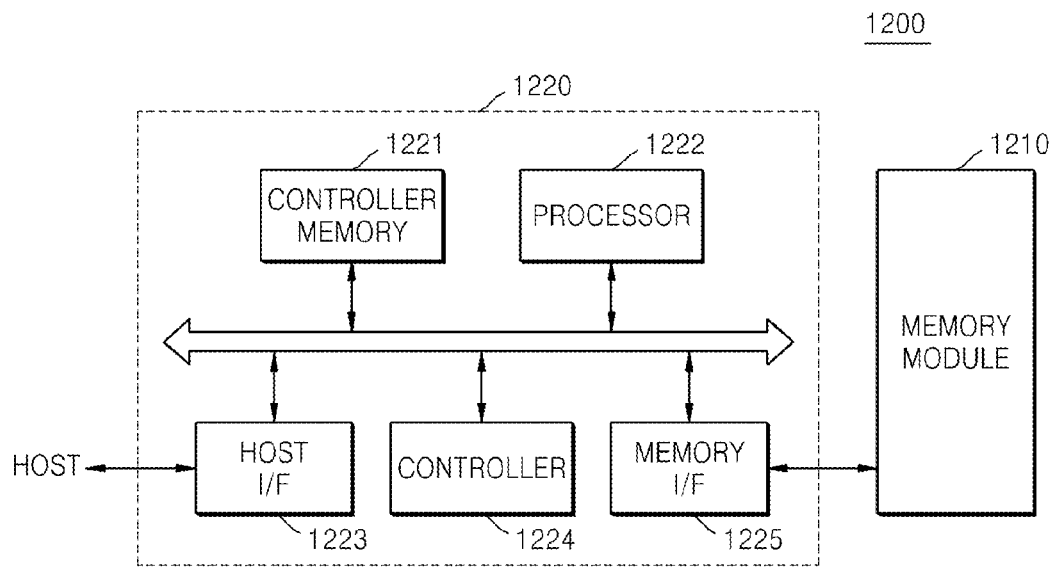
FIG. 11 is a block diagram of a memory card including an IC device manufactured by using a reflective photomask according to example embodiments of the inventive concepts.

FIG. 11 is a block diagram of a memory card including an IC device manufactured by using a reflective photomask according to example embodiments of the inventive concepts.

Referring to FIG. 11, a memory card 1200 may be configured to include a memory controller 1220 generating a command signal and an address signal and a memory module 1210 having at least one memory device such as a flash memory device. The memory controller 1220 may include a host interface 1223 configured to transmit a command signal and/or an address signal generated from the memory controller 1220 to a host or to receive the command signal and/or the address signal from the host, and a memory interface 1225 configured to transmit the command signal and/or the address signal to the memory module 1210 or to receive data stored in the memory module 1210 in response to the command signal and the address signal. The memory controller 1220 may further include a controller 1224, a controller memory 1221 such as SRAM and a processor 1222 such as a central processing unit (CPU) that communicate with the host interface 1223 and the memory interface 1225 through a common bus.

The memory module 1210 may receive the command signal and the address signal from the memory controller 1220 and may store data in at least one memory device thereof in response to the command signal and the address signal. Each memory device constituting the memory module 1210 may include a plurality of memory cells having their own addresses and a decoder receiving the command signal and the address signal to generate a row signal and a column signal for accessing at least one memory cell in a program mode or in a read mode.

At least one of the components constituting the memory card 1200, for example, at least one of the controller memory 1221, the processor 1222, the host interface 1223, the controller 1224, and the memory interface 1225 constituting the memory controller 1220 or at least one of the memory devices constituting the memory module 1210 may include an integrated circuit fabricated using at least one of the reflective photomasks obtained from the reflective photomask blank 100 illustrated in FIG. 1, and using at least one of the reflective photomasks 600 and 700 illustrated in FIGS. 6E and 7E.

Figure 12:
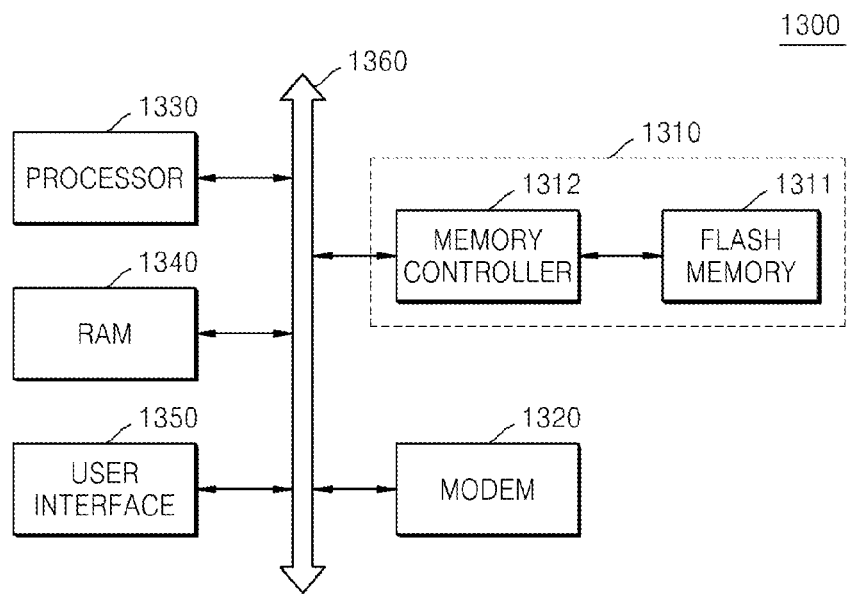
FIG. 12 is a block diagram of a memory system using a memory card including an IC device manufactured by using a reflective photomask according to example embodiments of the inventive concepts.

FIG. 12 is a block diagram of a memory system using a memory card including an IC device manufactured by using a reflective photomask according to example embodiments of the inventive concepts.

Referring to FIG. 12, a memory system 1300 may include a processor 1330, a random access memory (RAM) device 1340, a user interface 1350, a modem 1320, and a memory card 1310 that communicate with each other through a common bus 1360. In particular, the processor 1330, the RAM device 1340, the user interface 1350 and the modem 1320 may transmit signals to the memory card 1310 through the common bus 1360 and may receive signals from the memory card 1310 through the common bus 1360. At least one of the processor 1330, the RAM device 1340, the user interface 1350, the modem 1320, and the memory card 1310 constituting the memory system 1300 may include an integrated circuit fabricated using at least one of the reflective photomasks obtained from the reflective photomask blank 100 illustrated in FIG. 1 and using at least one of the reflective photomasks 600 and 700 illustrated in FIGS. 6E and 7E.

The memory system 1300 may be applicable to various electronic systems, for example, solid state disks (SSDs), CMOS image sensors (CISs), computer systems, or the like.

The semiconductor system 1330, the memory card 1200 and each component thereof may be encapsulated using any one of a ball grid array (BGA) technique, a chip scale package (CSP) technique, a plastic leaded chip carrier (PLCC) technique, a plastic dual in-line package (PDIP) technique, a multi-chip package (MCP) technique, a wafer-level fabricated package (WFP) technique, a wafer-level processed stack package (WSP) technique, and the like. However, example embodiments of the inventive concepts are not limited thereto.

While example embodiments of the inventive concepts have been particularly shown and described with reference to example embodiments thereof, it will be understood that various changes in form and details may be made therein without departing from the spirit and scope of the following claims.

What is claimed is:

1. A reflective photomask blank, comprising:
a multi-layered reflection layer on a photomask substrate;
a capping layer on the multi-layered reflection layer, the capping layer including a first transition metal;
a passivation film contacting at least a portion of the capping layer on a side opposite to the multi-layered reflection layer, the passivation film including a second transition metal and a nitrogen (N) atom;
a light absorption layer above the capping layer relative to the photomask substrate; and
a buffer layer between the capping layer and the light absorption layer, the buffer layer including a different element than the capping layer and the passivation film.

2. The reflective photomask blank of claim 1, wherein the capping layer includes ruthenium (Ru).

3. The reflective photomask blank of claim 1, wherein at least a portion of the passivation film is formed of a metal nitride including ruthenium (Ru) and the nitrogen (N) atom.

4. The reflective photomask blank of claim 1, wherein at least a portion of the passivation film is formed of a metal oxynitride including ruthenium (Ru), oxygen (O), and the nitrogen (N) atom.

5. The reflective photomask blank of claim 1, wherein the passivation film has a N concentration distribution in which the content of nitrogen is smaller towards the capping layer from a surface of the passivation film opposite to the capping layer along a thickness direction of the passivation film.

6. The reflective photomask blank of claim 1, wherein the passivation film is between the capping layer and the light absorption layer.

7. A reflective photomask, comprising:
a multi-layered reflection layer on a photomask substrate;
a capping layer on the multi-layered reflection layer, the capping layer including a first transition metal;
a passivation film contacting at least a portion of the capping layer on a side opposite to the multi-layered reflection layer, the passivation film including a second transition metal and a nitrogen (N) atom;
a light absorption pattern above the capping layer relative to the photomask substrate; and
a buffer pattern between the capping layer and the light absorption pattern, the buffer pattern including a different element than the capping layer and the passivation film.

8. The reflective photomask of claim 7, wherein the passivation film includes a portion between the capping layer and the light absorption pattern.

9. The reflective photomask of claim 7, wherein
the passivation film includes an exposed first portion and a second portion between the capping layer and the light absorption pattern, and
the exposed first portion and the second portion each independently contact the capping layer.

10. The reflective photomask of claim 7, wherein
the passivation film includes a first portion contacting the capping layer and a second portion covering the light absorption pattern, and
the second portion is spaced apart from the capping layer.

11. The reflective photomask of claim 10, wherein the first portion and the second portion of the passivation film are each independently exposed.

12. The reflective photomask of claim 10, wherein the first portion and the second portion are formed of different elements.

13. The reflective photomask of claim 10, wherein the first portion and the second portion are formed of the same elements.

14. An integrated circuit (IC) device manufactured by using the reflective photomask according to claim 7.

15. A reflective photomask, comprising:
- at least one reflection layer on a photomask substrate;
- a layer resistant to oxidation, the layer resistant to oxidation at least partially covering the at least one reflection layer, and the layer resistant to oxidation including a first transition metal;
- a light absorption layer on at least a portion the layer resistant to oxidation;
- a passivation film above the layer resistant to oxidation relative to the photomask substrate, the passivation film including a second transition metal and a nitrogen (N) atom; and
- a buffer layer between the layer resistant to oxidation and the light absorption layer, the buffer layer including a different element than the layer resistant to oxidation and the passivation film.

16. The reflective photomask of claim 15, wherein the passivation film contacts at least a portion of the layer resistant to oxidation.

17. The reflective photomask of claim 16, wherein an upper surface of the passivation film is at least partially exposed.

18. The reflective photomask of claim 17, wherein the first and second transition metals are ruthenium, and a concentration of the ruthenium in the passivation film either decreases or remains the same from the upper surface of the passivation film toward a lower surface of the passivation film.

19. The reflective photomask of claim 16, wherein at least one of the first transition metal and the second transition metal is ruthenium.

* * * * *